United States Patent [19]
Ohsawa et al.

[11] Patent Number: 5,645,419
[45] Date of Patent: Jul. 8, 1997

[54] HEAT TREATMENT METHOD AND DEVICE

[75] Inventors: Tetsu Ohsawa; Hiroyuki Iwai, both of Sagamihara; Hisashi Kikuchi, Esashi; Shingo Watanabe, Kanagawa-Ken; Keiji Takano, Esashi; Tsutomu Haraoka; Ken Nakao, both of Sagamihara, all of Japan

[73] Assignees: Tokyo Electron Kabushiki Kaisha, Tokyo-To; Tokyo Electron Tohoku Kabushiki Kaisha, Iwate-Ken, both of Japan

[21] Appl. No.: 409,098

[22] Filed: Mar. 23, 1995

[30] Foreign Application Priority Data

| | | | |
|---|---|---|---|
| Mar. 29, 1994 | [JP] | Japan | 6-082400 |
| Apr. 4, 1994 | [JP] | Japan | 6-089099 |
| Jul. 5, 1994 | [JP] | Japan | 6-176080 |

[51] Int. Cl.⁶ ........................ F23D 11/44
[52] U.S. Cl. .................... 432/241; 432/253
[58] Field of Search ............... 432/239, 241, 432/242, 247, 253; 118/724

[56] References Cited

U.S. PATENT DOCUMENTS

| | | |
|---|---|---|
| 5,110,248 | 5/1992 | Asano et al. . |
| 5,181,819 | 1/1993 | Sakata et al. . |
| 5,219,464 | 6/1993 | Yamaga et al. . |
| 5,261,167 | 11/1993 | Sakata ............ 34/82 |

FOREIGN PATENT DOCUMENTS

| | | |
|---|---|---|
| 4-148717 | 5/1992 | Japan . |
| 4-133422 | 5/1992 | Japan . |

*Primary Examiner*—Henry A. Bennett
*Assistant Examiner*—Jiping Lu
*Attorney, Agent, or Firm*—Beveridge, Degrandi Weilacher & Young, LLP

[57] ABSTRACT

A heat treatment device including a handling chamber that has a carriers feed in/out opening for carriers holding plural sheets of objects to be treated parallelly vertical, a vertical heat treatment furnace for heat treating the objects and a posture changer for swinging the carriers near the carriers feed in/out opening of the handling chamber on a rotational center into a territory of lower sides of the carriers to change the posture of the objects to be treated from the vertical position to the horizontal position. The heat treatment device also has a carriers storage unit disposed above the posture changing means for storing a plural number of posture changed carriers, conveying device for conveying the carriers between the storage unit and the posture changing device and the heat treatment furnace side. Also, provided is a transferrer for transferring the objects-to-be-treated to/from an objects-to-be-treated holder for loading and unloading into/out of the heat treatment furnace side. The posture changer swings the carriers on the rotational center to sides of the carriers to change the carriers' posture from vertical to horizontal so the carriers have postures changed along a swing track of a minimum radius with small bulge amounts and a minimum moving amount. Thus, a conveying distance and a conveying time for conveying the posture changed carriers to the upper storage unit be reduced, and the heat treatment device can be smaller-sized and have improved processing efficiency.

10 Claims, 15 Drawing Sheets

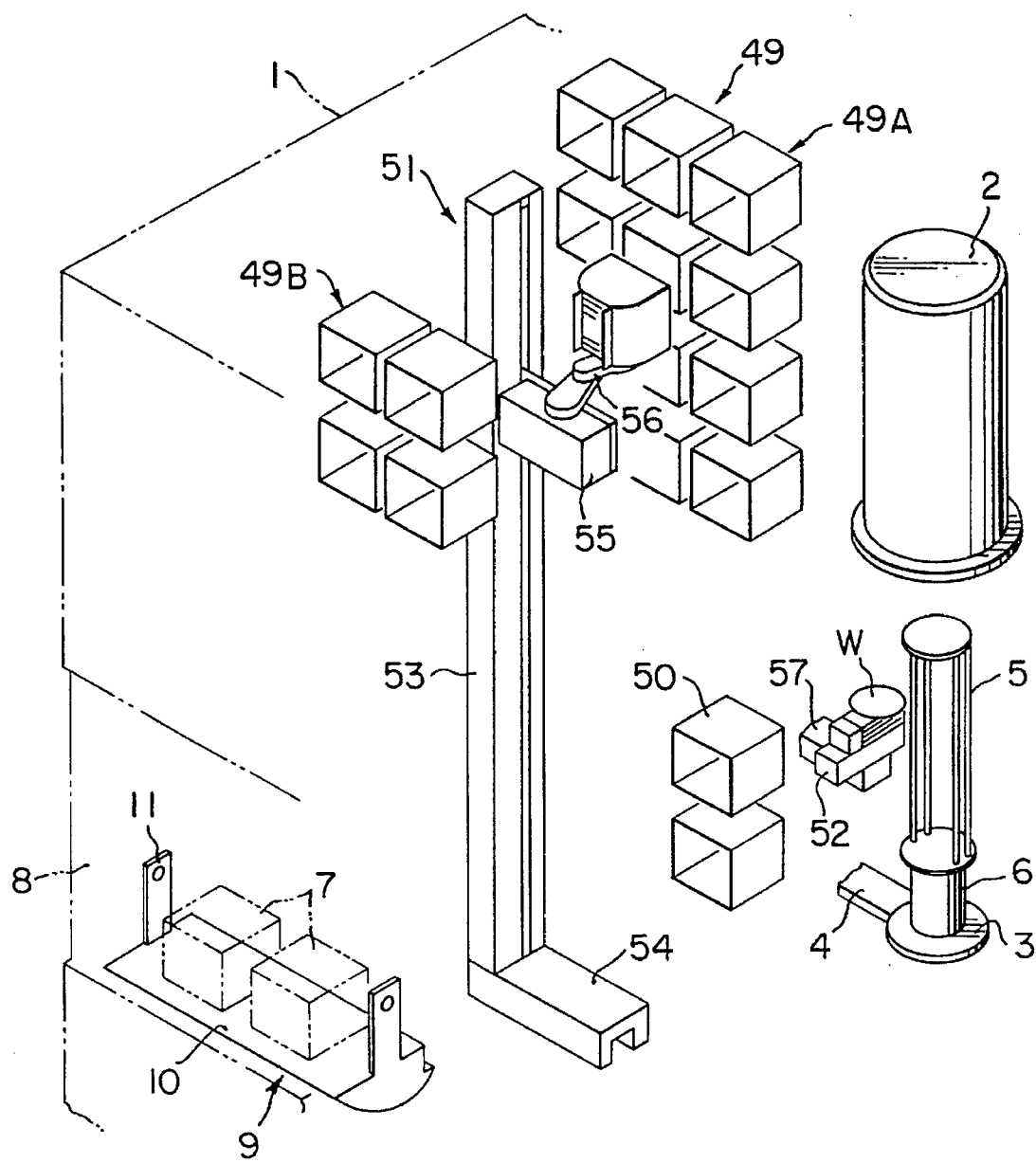
F I G. 2

HEAT TREATMENT METHOD AND DEVICE

BACKGROUND OF THE INVENTION

The present invention relates to a heat treatment method and device.

Semiconductor device fabrication processes generally include steps in which various treatments, such as oxidation, diffusion, CVD, etc. are made on semiconductor wafers, objects to be treated. Various treatment devices have been already proposed from the viewpoint of higher throughputs of such treatment steps, cleanness, space savings, etc. (see, e.g., Japanese Patent Publication No. 27121/1992, Japanese Patent Laid-Open Publication No. 133422/1992, Japanese Patent Laid-Open Publication No. 148717/1992, etc.)

The treatment device described in, e.g., Japanese Patent Laid-Open Publication No. 148717/1992 has, as shown in FIG. 20, a vertical heat treatment furnace 2 in a box-shaped handling chamber 1, and a carriers feed in/out opening 8 in the front side of the handling chamber 1, through which carriers 7 each holding a plurality of semiconductor wafers W vertical enter and exit the handling chamber 1. In this case, the semiconductor wafers W held vertical in the carriers must be horizontally transferred onto a wafer boat 5 which is an objects-to-be-treated holder to be loaded into and unloaded out of the vertical heat treatment furnace 2. To this end, as shown in FIG. 21, near the carriers feed in/out opening 8 there are provided posture changing mechanisms each comprising a mount 10 for a carrier to be mounted on and which is swung on the rotational center to thereby change the postures of the carrier 7 thereon so that the semiconductors wafer W held on the carrier 7 have its vertical posture and horizontal posture.

The posture changing mechanisms 9 swing the mounts 10 by 90 degrees into empty spaces S1 defined below the mounts 10 to thereby change the posture of the carriers. The thus-posture changed carriers by the posture changing mechanisms 9 are conveyed by conveying mechanisms 51 into an upper accommodation portion in a number necessary for a treatment. The carriers in the accommodation portion are conveyed one by one to the side of the heat treatment furnace, and the semiconductor wafers W in the carriers taken out one by one by a transferring mechanism 52 onto the wafer boat.

In this conventional treatment device, the mounts are swung downward to change the posture of the carriers, and sufficient empty spaces for the mounts to be swung downward is needed. In addition, a sufficient space to keep the conveying mechanisms from interfering with the carriers projecting on the swing along a set swing trajectory when the mounts are swung is needed on the side of the conveying mechanisms. Thus the conventional treatment device has a limit to space saving and accordingly to down-sizing. Long distances of the swing and the conveyance of the carriers make treatment times longer, which is a limit to improvement of throughputs, i.e., efficiency of treatments.

In the handling chamber of the conventional treatment device there are provided a first air cleaning unit which injects clean air let in at the top of the handling chamber from the outside, a second air cleaning unit which draws the clean air injected by the first air cleaning unit and injects the clean air downward along the carrier opening, and a third air cleaning unit which draws the clean air which has been injected by the second air cleaning unit and reached below is drawn through a bottom duct and injects the clean air horizontally from one side wall of the heat treatment furnace to the other side wall thereof, and an exhaust duct which exhausts outside at a back side the clean air which has arrived at the other side wall. An atmosphere in the treatment furnace is thus cleaned to reduce dust, whereby adhesion of particles to the semiconductor wafers W can be suppressed with a result that yields of semiconductor devices which tend to be increasingly micronized can be improved.

But in the conventional treatment device, clean air is several times passed through the air cleaning units, which makes it impossible to sufficiently prevent contamination of semiconductor wafers W by dust. Furthermore, impurity gases of organic compounds, such as boron compounds, etc. generated by the dust removing filters of the air cleaning units tend to increase although in small amounts. Preventive measures to this are needed.

Furthermore, because clean air is uninterruptedly circulated sequentially throughout the handling chamber, it is difficult that an atmosphere in the handling chamber cannot be confined separately in the carriers handling space and in the wafers handling space (objects-to-be-treated handling space) in which the heat treatment furnace is housed, and the semiconductor wafers W are transferred between the carriers and the wafer boat.

SUMMARY OF THE INVENTION

An object of the present invention is to provide a treatment device and a treatment method which can be small sized and have improved processing efficiency.

To achieve the above-described object, the treatment device according to the present invention comprises a handling chamber including a carriers feed in/out opening for carriers holding plural sheets of objects to be treated parallelly vertical, and housing a vertical heat treatment furnace for heat treating the objects to be treated; posture changing means disposed in the handling chamber and near the carriers feed in/out opening for swinging the carriers near the carriers feed in/out opening of the handling chamber on a rotational center into a territory of lower sides of the carriers to change the posture of the objects to be treated from the vertical position to the horizontal position; a carriers storage unit disposed above the posture changing means and being capable of storing a plural number of the carriers whose posture has been changed; conveying means for conveying the carriers between the carriers storage unit and the posture changing means, and the side of the heat treatment furnace; and transfer means for transferring the objects-to-be-treated to/from an objects-to-be-treated holder for loading and unloading into/out of the heat treatment furnace the carriers conveyed to the side of the heat treatment furnace.

The treatment method according to the present invention, in conveying carriers holding plural sheets of objects to be treated parallelly vertical into a vertical heat treatment furnace through a carriers feed in/out opening of a handling chamber accommodating the vertical heat treatment furnace, comprises the steps of swinging the carriers near the carriers feed in/out opening of the handling chamber on a rotational center into a territory of lower sides of the carriers to change the posture of the objects to be treated from the vertical position to the horizontal position; and conveying the carriers whose posture has been changed to a carriers storage unit provided in an area above the carriers feed in/out opening.

According to the treatment device and method of the present invention, the posture changing means changes the posture of the carriers so that the carriers are swung on the rotational center to a territory of sides of the carriers so that the objects to be treated have the posture changed from the vertical position to the horizontal position, whereby the carriers can have the postures changed along a swing track of a minimum radius with small bulge amounts and a minimum moving amount. Accordingly the posture change of the carriers is quick, and a small space can allow the carriers to have the postures changed without interference with the conveying mechanism. A conveying distance and a conveying time for conveying the posture changed carriers to the upper storage unit can be reduced, and the heat treatment device can be smaller-sized and have improved processing efficiency.

Another object of the present invention is to provide a treatment device which can reduce contamination of objects to be treated by impurity gases, and easily isolate atmosphere in the handling chamber from the carriers handling space from the objects-to-be-treated handling space.

To achieve this object, the treatment device according to the present invention has the interior of the handling chamber divided in a carriers handling space which is defined in the handling chamber and in which carriers each holding plural sheets of objects to be treated are fed in/out, stored, and conveyed; an objects-to-be-treated handling space which is defined in the handling chamber, divides the carriers handling space from the handling chamber, houses a heat treatment furnace, includes an objects-to-be-treated holder for loading and unloading the objects to be treated into/out of the heat treatment furnace, and transfers the objects to be treated between the objects-to-be-treated holder and the carriers; and clean air circulation units which are independent from one another and which introduce to circulate clean air in the carriers handling space and the objects-to-be-treated handling space and discharges the clean air.

According to the treatment device of the present invention, the interior of the handling chamber is divided in the carriers handling space and the wafers handling space, and the clean air circulation units are provided independent from each other in these handling spaces. Accordingly in comparison with the conventional heat treatment device in which clean air is passed a plurality of times through the air cleaning units to continuously circulate the clean air through the entire interior of the handling chamber, clean air may be passed through the clean air units less times, so that impurity gases generated from the dust removing filters of the clean air units can be sufficiently decreased by the simple arrangement without the necessity of special countermeasures. Atmosphere in the handling chamber can be easily separated from the carriers handling space from the objects-to-be-treated handling space, so that the device is readily applicable to required treatment modes in which, for example, the interior of the objects-to-be-treated handling space alone is in an atmosphere of an inert gas.

BRIEF DESCRIPTION OF THE DRAWINGS

FIG. 2 is a perspective view diagrammatically showing a structure of the interior of the handling chamber of the treatment device of FIG. 1.

DETAILED DESCRIPTION OF THE PREFERRED EMBODIMENTS

[First Embodiment]

A first embodiment of the present invention will be explained with reference to the drawings.

Figure 1:
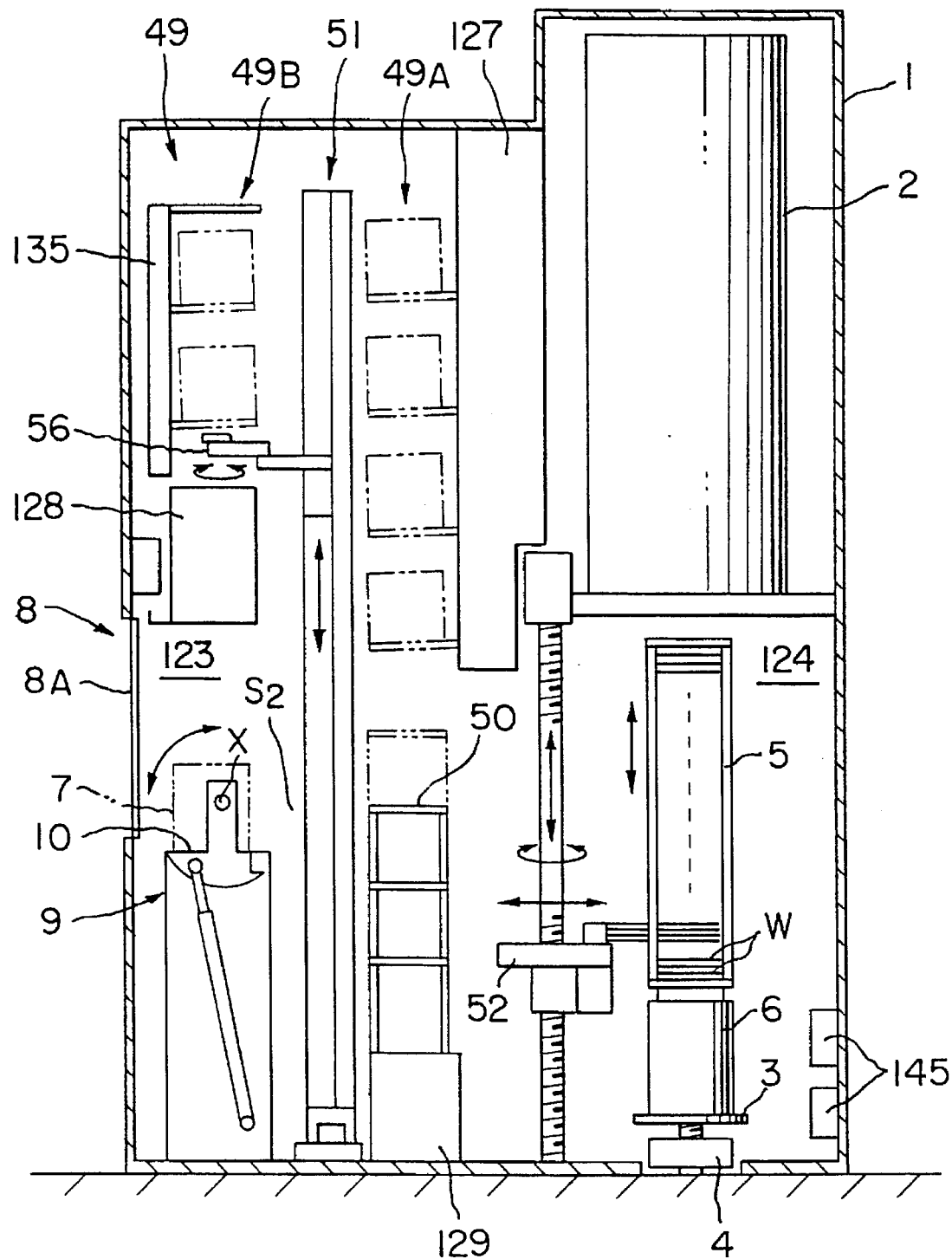
FIG. 1 is a diagrammatic vertical sectional view of the vertical heat treatment device according to a first embodiment of the treatment device of the present invention.

In FIG. 1 which schematically shows the structure of the heat treatment device according to the first embodiment of the present invention by a longitudinal section of the heat treatment device, reference numeral 1 indicates a handling chamber formed of, e.g., steel plates in a box-shape which is a housing of the treatment device. At an upper inner part of the interior of the handling chamber 1 there is disposed a vertical heat treatment furnace 2 which comprises a cylindrical reaction tube with a furnace entrance in the bottom thereof, and a heater, a heat insulator, etc. disposed around the outside of the reaction tube.

A cap 3 for closing and opening the furnace entrance is disposed movably up and down by a lift mechanism (boat elevator) 4 in a space (wafers handling space) 124 below the heat treatment furnace 2. An objects-to-be-treated holder, a wafer boat 5 of, e.g., quartz is mounted on the cap 3 through a heat insulating cylinder 6. The objects-to-be-treated holder holds a plurality (e.g., 150 sheets) of objects to be treated, e.g., semiconductor wafers W horizontal at a certain vertical interval. The wafer boat 5 holding the semiconductor wafers W is moved up and down together with the heat insulating cylinder 6 into and out of the heat treatment furnace 2 as the cap 3 is moved up and down.

On the other hand, a carriers feed in/out opening 8 with a slide door 8A of a transparent material is formed in the front side (the left side as viewed in FIG. 1) of the handling chamber 1. Through the carriers feed in/out opening 8 carriers 7 in the form of plastic containers each of which vertically parallelly holds a plurality (e.g., 25 sheets) of semiconductor wafers W are conveyed into and out of the handling chamber 1. A posture changing mechanism 9 is disposed near the carriers feed in/out opening 8 of the handling chamber 1. The posture changing mechanism 9 changes a posture of the carriers so that the semiconductor wafers W held vertically therein are horizontal.

A storage unit 49 in the form of shelves which accommodate the carriers which have had the posture changed is provided above the posture changing mechanism 9. On the side nearer to the heat treatment furnace 2 there is provided a transfer unit 50 for the carriers 7 to be temporarily stacked up to transfer the semiconductor wafers W to the wafer boat 5. A conveying mechanism 51 is disposed between the storage unit 49 and the transfer unit 50, and a transfer mechanism 52 is disposed between the transfer unit 50 and the wafer boat 5 in the wafers handling space 124. The transfer mechanism 51 transfers the semiconductor wafers W from and onto the carriers 7.

As shown in FIG. 1, the storage unit 49 of the first embodiment is divided in a front storage unit 49A and a rear storage unit 49B by the transfer mechanism 51 which is movable vertically in parallelism with the front edge of a mount 10. The front storage unit 49A stores, e.g., totally 12 carriers vertically and parallelly, and the storage unit 49B stores, e.g., totally 4 carriers vertically and parallelly.

The transfer unit 50 is disposed below the front storage unit 49A and can mount, e.g., two carriers vertically one on another.

As shown in FIG. 2, the conveying mechanism 51 comprises a run 54 with a vertical support rod 53, a lift frame 55 which is movable up an down along the support rod 53, and a conveyance arm 56 provided capable of being horizontally folded on the lift frame 55 and supports the carriers 7 at the bottoms thereof. The conveying mechanism 51 is movable and capable of being folded between the mount 10 and the storage unit 49, the storage unit 49 and the transfer unit 50, and the mount 10 and the transfer unit 50 to receive and transfer the carriers 7.

Figure 3:
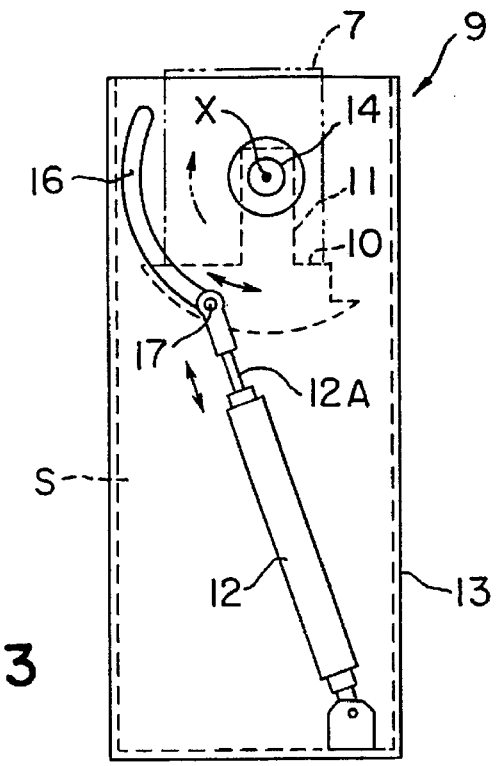
FIG. 3 is a side view of the posture changing mechanism of the treatment device of FIG. 1.
Figure 4:
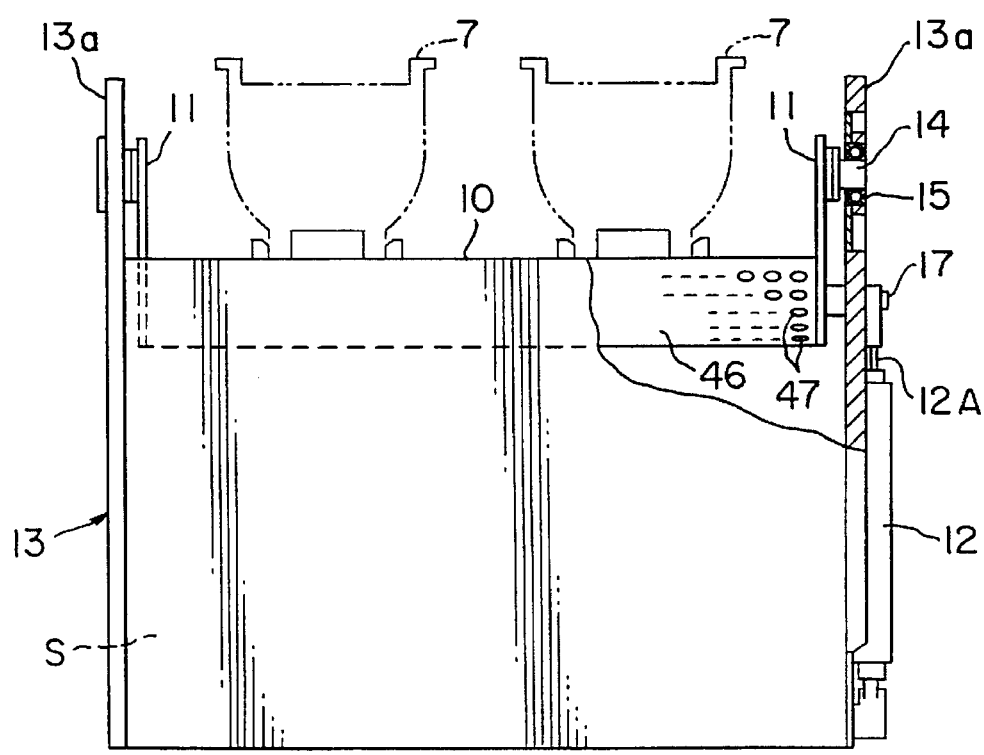
FIG. 4 is a front view of the posture changing mechanism of the treatment device of FIG. 1.

As shown in FIGS. 3 and 4, the posture changing mechanism 9 comprises a mount 10 which mounts the carriers 7, swing arms 11 supporting the mount 10 swingably on a rotation center X set in a territory of side surfaces of the carriers 7, and an air cylinder 12 which swings the mount 10 for mounting the carriers 7 on the rotation center X to raise the mount 10 from its horizontal state to its vertical state on the side of the carriers feed in/out opening 8.

The mount 10 used in the first embodiment is made of a horizontally long flat plate of, e.g., stainless steel which can accommodate two carriers thereon side by side, and the swing arms 11 are fixed to both sides of the mount 10. The mount 10 is placed on the top of frame 13 in the shape of a box with the top opened. The swing arms 11 are rotatably supported on both side walls 13a of the frame 13 by support pins 14 which are the rotation centers X, and bearings 15. An arcuate slit 16 is formed with a support pin 14 as the center in one of the side walls 13a of the frame 13. A crank pin 17 is passed through the slit 16 and through the frame 13 and further extended out of one of the swing arms 11. The crank pin 17 is connected to the rod 12A of an air cylinder 12. The air cylinder 12 is driven to extend the rod 12A, whereby the mount 10 is swung on the support pin 14 between its horizontal state and its vertical state on the side of the carriers feed in/out opening 8. In the frame 13 a sufficient space S can be accordingly defined below the mount 10 which is used as a storage space for, e.g., control devices, etc.

Figure 7:
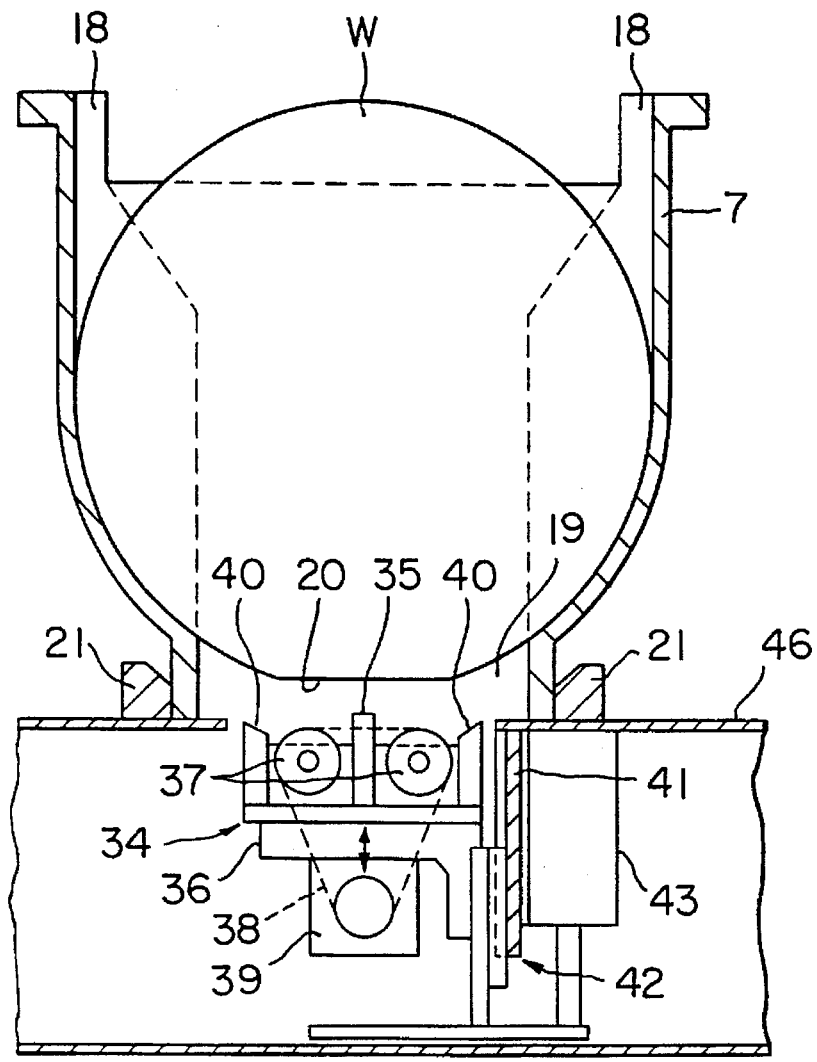
FIG. 7 is a vertical sectional view of a wafers arranging mechanism and a wafer sensor incorporated in the mount of FIG. 5.

As shown in FIG. 7, each carrier 7 has the top opened, and has grooves 18 formed opposed to each other in both side walls thereof for rotatably holding a plurality of circular semiconductor wafers W vertically parallelly. In the bottom of the carrier there is formed a through-opening from the front to the rear in a direction of arrangement of the semiconductors W. An orientation flat (hereinafter called an orientation flat portion), which is a cut for alignment of the semiconductor wafers W, is formed on a part of the peripheral edge. The semiconductor wafers W are aligned by orientation flat arranging mechanisms 34 which will be described later so that the orientation flat portions 20 are oriented in a set direction.

Figure 5:
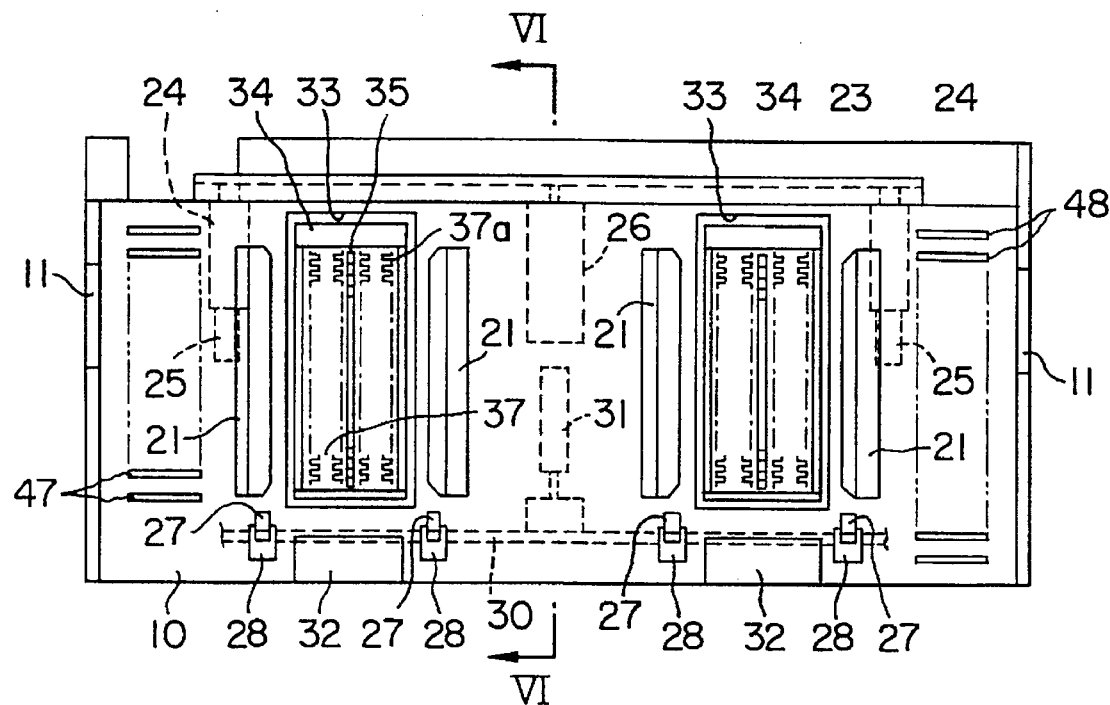
FIG. 5 is a plan view of the mount of the posture changing mechanism of FIG. 1.
Figure 6:
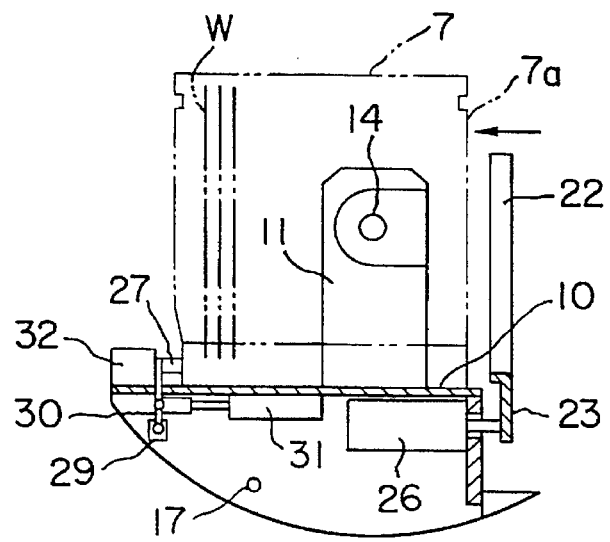
FIG. 6 is a sectional view along the line VI—VI in FIG. 5.

As shown in FIGS. 5 to 7, positioning members 21 for positioning both sides of the bottoms of the carriers 7 are provided on the upper surface of the mount 10. Receivers 22 are provided on the front edges of the mount 10 opposite to the carriers feed in/out opening 8 for positioning the front edges 7a of the carriers 7 and the bottoms (the front edges 7a) of the carriers 7 which have had the posture changed. The receivers 22 support both sides of the bottoms of the carriers 7 which have had the posture changed so that the carriers 7 are supported by the conveying mechanism 51. The receivers 22 are provided on a front clamp bar 23 uninterruptedly along the rear edge of the mount 10. The front clamp bar 23 is movable from the front edge of the mount 10 to the rear edge thereof by a pair of guides 24 and a pair of guide rods 25 disposed on both sides of the underside of the mount 10. An air cylinder 26 for driving the front clamp bar 23 forward and rearward of the mount 10 is provided at the center of the underside of the mount 10.

Couples of clamp members 27 are extended through through-holes 28 formed in the rear edge of the mount 10. Each couple of clamp members 27 are provided for each carrier, and abuts on the rear end of the carrier 7 to camp the carrier 7 at the front and the rear together with the associated receiver 22. These lamp members 27 are provided on a rear clamp bar 30 which is rotatably supported on the underside of the mount 10 through a bracket. An air cylinder 31 is provided at the center of the underside of the mount 10 for rotating the rear clamp bar 30 forward and backward.

As shown in FIGS. 5 and 6, on the rear edge of the mount 10 there are provided optical alignment detecting sensors 32 which detect whether or not the orientation flat portions 20 of all the semiconductors W held in the carriers 7 are faced forward, i.e., are in alignment. As shown in FIG. 7, openings 33 are formed in the mount 10 opposed to the bottom openings 19 of the carriers 7. The orientation flat arranging mechanisms 34 for arranging the semiconductor wafers W, and optical sensors (hereinafter called wafer sensors) 35 for sensing the semiconductor wafers W are provided on the underside of the mount 10 capably of being lifted out of the associated openings 33.

These orientation flat arranging mechanisms 34 and the wafer sensors 35 may be known art in, e.g., Japanese Patent Laid-Open Publication No. 30554/1992. As shown in FIGS. 5 and 7, each orientation flat arranging mechanism 34 comprises a pair of left and right rotation rollers 37 which is disposed on a support frame 36, spaced from each other by a width of the orientation flat portions 20 and have a plurality of annular grooves 37a for supporting the semiconductor wafers W, a motor which rotates the rotation rollers 37 by a belt 38 in the same direction, and a pair of wafer guides 40.

As shown in FIG. 7, the support frame 36 is supported by a base frame 41 disposed on the underside of the mount 10 movably up and down along a lift guide 42. On the base frame 41 there is provided an air cylinder 43 which moves up and down the support frame 36. Each orientation flat arranging mechanism 43 is lifted by the associated air cylinder 43 and supports the semiconductor wafers W by the rotation rollers 37 which are rotated in the direction indicated by a pair of arrows. The semiconductor wafers W are rotated by the rotation rollers 37, and the orientation flat portions 20 are brought to be on the rotation rollers 37 with the peripheral edges of the semiconductor wafers W in contact with the wafer guides 40, whereby a gap is formed between the orientation flat portions 20 and the rotation rollers 37, and the rotation of the semiconductor wafers W is stopped. Then the air cylinder 43 is lowered, lowering the rotation rollers 37. Thus the semiconductor wafers W are aligned.

Figure 8:
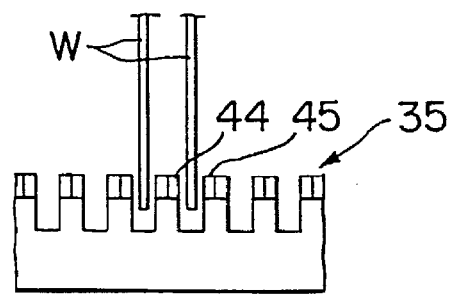
FIG. 8 is a partially enlarged side view of the wafer sensor of FIG. 7.

As shown in FIG. 7, each wafer sensor 35 is disposed between the rotation rollers 37 of each pair. As shown in FIG. 8, the end of the wafer sensor 35 to be opposed to the orientation flat portions 20 of the wafers W are formed in digits. A light irradiation device 44 and a light detecting device 45 are provided respectively on the opposed walls of each digit, so that presence of a semiconductor wafer W between the devices is sensed.

As shown in FIG. 6, a cover 46 of, e.g., stainless steel which is curved with the support pin 14 as the center is provided below the mount 10 for covering the orientation flat arranging mechanism 34, etc. on the underside of the mount 10. A number of vent holes 47, 48 are formed through the cover 46 and the mount 10 for passing clean air streams flowing from above the mount below.

Figure 10:
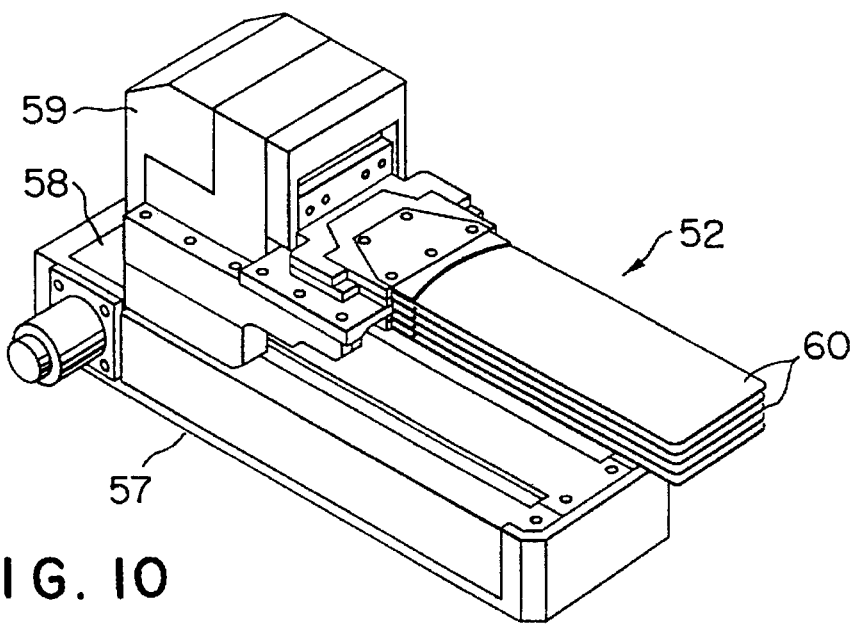
FIG. 10 is a perspective view of the transfer mechanism for wafers.
Figure 11:
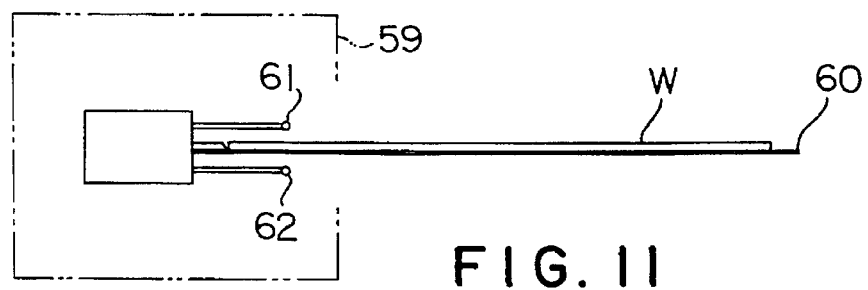
FIG. 11 is a side view of the wafer sensor provided in the transfer mechanism of FIG. 10.

A shown in FIG. 10, the transfer mechanism 52 comprises a lift frame 57 which is movable up and down, a rectangular rotary frame 58 which is disposed on the lift frame 57 horizontally turnable, a movable body 59 which is disposed on the rotary frame 58 and is reciprocally movable along a guide in the direction of length of the rotary frame 58, and plate-shaped transfer arms 60 which support a plurality (e.g., 5 sheets) of semiconductor wafers W at a vertical interval. The transfer mechanism 52 takes out one by one the semiconductor wafers W-to-be-treated in the carriers 7 in the transfer unit 50 to transfer them to the wafer boat 5, and takes the treated semiconductor wafers W one by one out of the wafer boat 5 to transfer them into the empty carriers in the transfer unit 50. As shown in FIG. 11, on one side of the proximal end of each transfer arm 60 there is provided a wafer sensor 63 comprising a light irradiation device 61 and a light detecting device 62 which are vertically opposed to each other with a semiconductor wafer W supported on the transfer arm 60, so that presence of the semiconductor wafer W on the transfer arm 60 can be sensed.

Then, a conveying operation for the carriers 7 according to the first embodiment will be explained. First, as shown in FIGS. 1 and 2, the carriers 7 are placed by, e.g., a conveyance robot or other means two by two on the mount 10 of the posture changing mechanism 9 through the carriers feed in/out opening 8 of the treatment device. On the mount 10 the semiconductor wafers W in the carriers 7 are aligned in a set direction by the orientation flat arranging mechanism 34 (see FIG. 7), and presence and a number of the semiconductor wafers W are detected by the wafer sensor 35.

Figure 9:
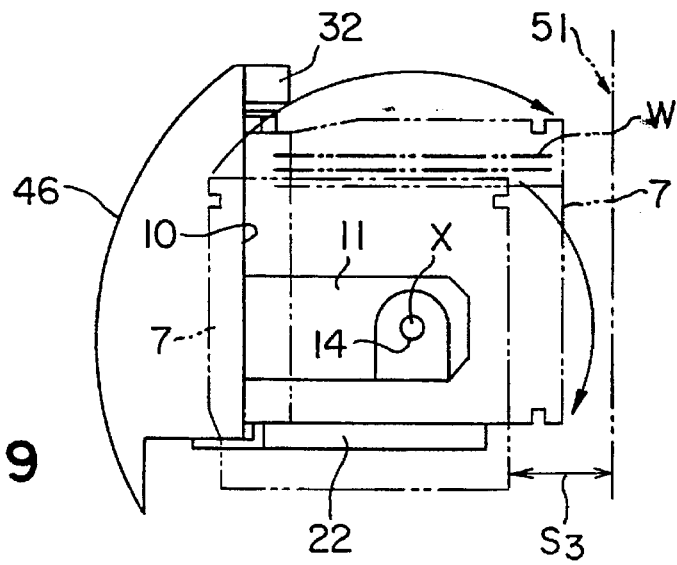
FIG. 9 is a side view of the mount in the state where wafers have the posture changed from the vertical position to the horizontal position.

Then, the receivers 22 are moved (in the direction of the arrow in FIG. 6) to position the carriers 7, and clamps the carriers 7 together with the clamp member 27. Then the air cylinder 12 (see FIG. 3) is drive, as shown in FIG. 9, the carriers 7 are swung together with the mount 10 by 90 degrees on the support pin 14 at the rotation center X in the territory of the side surfaces of the carriers 7, whereby the posture of the carriers is changed so that the semiconductor wafers W, which have been parallelly vertically arranged are horizontal. That is, the posture change is conducted along a line of horizontal displacement of the carriers 7 (conveyance thereof into the treatment device). The carriers 7 come to be supported by the receiver 22 by the posture change, and the air cylinder 31 is driven to retreat the clamp member 27 to release the carriers 7 from the clamp. The carriers 7 are conveyed to the storage unit 49 by the conveying mechanism 51. This operation is repeated to store a required number of the carriers 7 in the storage unit 49. Then the carriers 7 in the storage unit 49 are conveyed one by one to the transfer unit 50 by the conveying mechanism 51, and the semiconductor wafers W in the carriers 7 are transferred by the transfer mechanism 52 one by one to the wafer boat 5 lowered on the loading area 7. The emptied carriers 7 are lifted by the conveying mechanism 51 to be returned one by one to the storage unit 49.

Then when a required number of the semiconductor wafers W have been transferred to the wafer boat 5, the wafer boat 5 and the heat insulating cylinder 6 are lifted by the lift mechanism 4 into the heat treatment furnace 2. Then the furnace entrance is closed by the cap 3, and a heat treatment is conducted on the semiconductor wafers W for a required period of time, at a required temperature and in a required atmosphere, and when the heat treatment is over, the wafer boat 5 is lowered out of the heat treatment furnace 2 to be unloaded into the loading area. The treated semiconductor wafer W are cooled and then are transferred into the carriers 7 from the wafer boat one by one in the order opposite to the above. The carriers 7 are conveyed to the storage unit 49 to be stored there. Then the carriers 7 have the posture changed through the mount 10 and are conveyed out of the handling chamber through the carriers feed in/out opening 8.

As described above, because the carriers 7 are swung near the carriers feed in/out opening 8 on the rotation center X in a territory of the side surfaces of the carriers near the carriers feed in/out opening 8 of the handling chamber 1, as shown in FIG. 9, the carriers can have the postures changed along a swing trajectory with a small bulging amount, a minimum radius and a minimum displacement amount, and in addition, the posture change can utilize a space above the mount 10. Accordingly, the posture change of the carriers 7 is quickly conducted, whereby the space S2 for the prevention of interference between the carriers 7 and the transfer mechanism 51 upon the posture change can be reduced; a conveying distance and a conveying time for conveying upward into the storage unit 49 the carriers 7 which have had the posture changed can be reduced; the device can be small-sized; and higher treatment efficiency can be obtained. Because the mount 10 with the carriers 7 mounted on is supported swingably by the swing arm 11 on the rotation center X set in a territory of the side surfaces of the carriers 7, and is swung by the air cylinder 12 so as to be raised vertical on the side of the conveying in/out opening, and the carriers 7 whose posture have been changed are supported by the receivers 22 at the lower parts thereof, whereby the posture change of the carriers 7 can be conducted by the simple arrangement without failure.

Because the orientation flat arranging mechanisms 34 for aligning the semiconductor wafers W in the carriers in a set direction are provided within the mounts 10, the mounts 10 are allowed to be swung into the empty space S3 below to change the postures of the carriers. Thus, different from the conventional treatment device in which the orientation flat arranging mechanisms are lifted into the empty space S from below by the lift mechanisms to be placed on the mount, the device according to the present first embodiment can be small-sized, and the empty space S below the mount 10 can be effectively utilized as a space for, e.g., controllers, etc. Because of the wafer sensors 35 for sensing semiconductor wafers W in the carriers 7 provided in the mount 10, presence of the semiconductor wafers W in the carriers, and numbers of the semiconductor wafers W in the carriers can be sensed. A number of sheets of semiconductor wafers W, etc. can be easily administered.

The present invention is not limited to the first embodiment described above and covers other modifications and variations within the scope of the present invention. For example, the orientation flat arranging mechanisms 34 do not arrange semiconductor wafers W essentially by means of the orientation flat portions 20, but may arrange them by means of other cuts, such as notches. The orientation flat arranging mechanisms 34 and the wafer sensors 35 are not essential and may be provided as required in the mount 10. Objects to be treated can be, e.g., LCD substrates in addition to semiconductor wafers W.

In the first embodiment the carriers are conveyed from the mount 10, which is the posture changing mechanism 9 to the storage unit and temporarily stored there so as to be transferred to the transfer unit 50, but to transfer semiconductor wafers W while the carriers 7 are being conveyed to the storage unit 49, the carriers may be conveyed from the mount 10, which is the posture changing mechanism 9, directly to the transfer unit 50.

Figure 12:
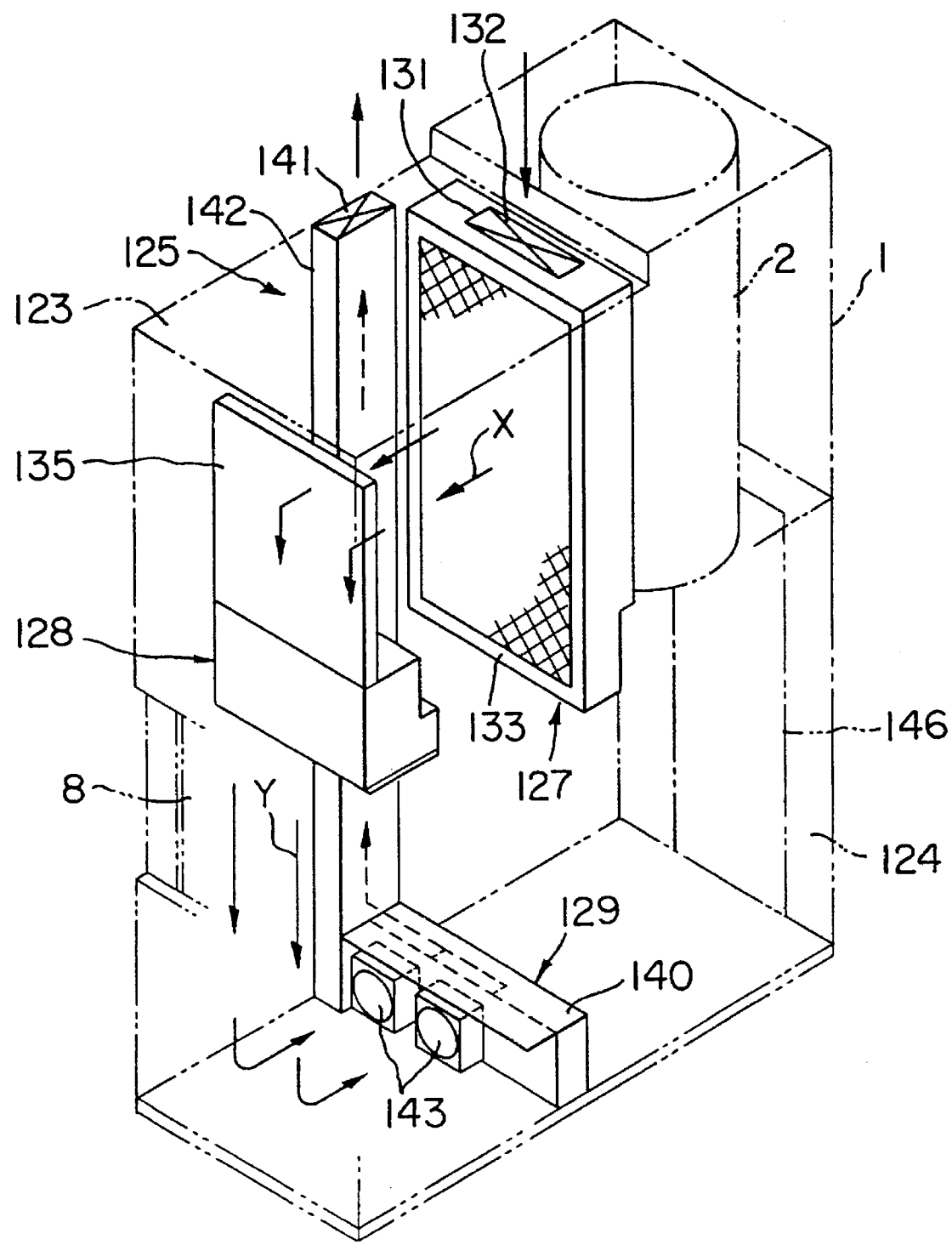
FIG. 12 is a perspective view of the clean air circulation unit disposed in the carriers handling space of the treatment device according to the present invention.
Figure 13:
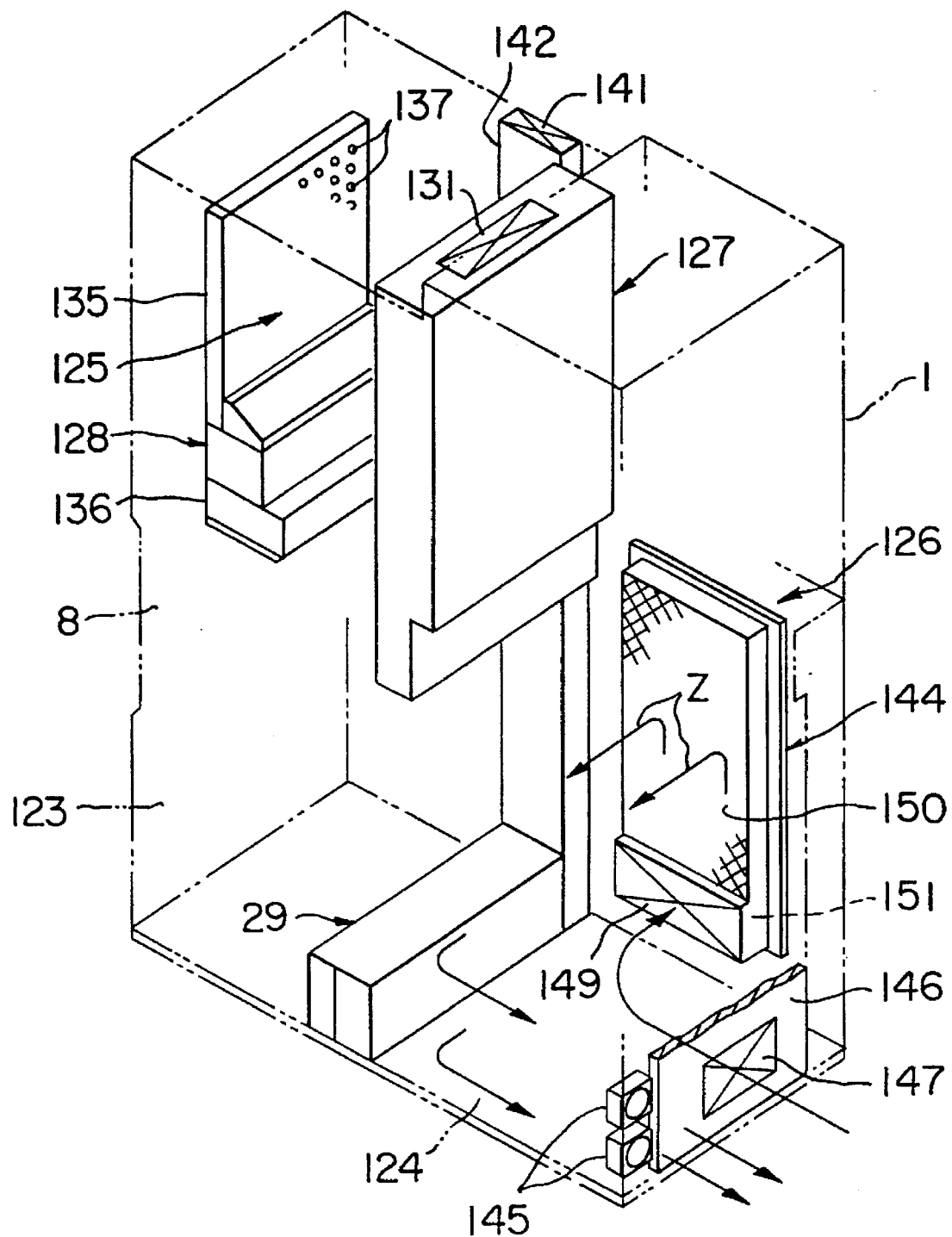
FIG. 13 is a perspective view of the clean air circulation unit disposed in the wafers handling space of the treatment device according to the present invention.

Furthermore, a clean air circulation system of the heat treatment device according to the first embodiment will be explained. As shown in FIG. 1, the interior of the handling chamber 1 is divided in a carriers handling space 123 where the carriers 7 are fed in/out, stored and conveyed, and a wafers handling space (objects-to-be-treated handling space) 124 which houses the heat treatment furnace 2 and in which semiconductor wafers W are transferred between the wafer boat, which is loaded and unloaded into/out of the heat treatment furnace 2 and the carriers 7. As shown in FIGS. 12 to 13, the carriers handling space 123 and the wafers handling space 124 have their respective clean air circulation systems 125, 126 independent from each other which introduce and circulate clean air and discharge the used clean air.

The clean air circulation system 125 of the carriers handling space 123 includes a first clean air unit 127 which injects clean air introduced at the top of the handling chamber 1 from the outside, horizontally into the carriers storage unit 49, which is an upper part of the carriers handling space 123, a second clean air unit which draws the clean air injected by the first clean air unit 127 and injects downward the clean air along the carriers feed in/out opening 8 in the front of the handling chamber 1, and an exhaust duct unit 129 which discharges from the handling chamber 1 the clean air which has been injected by the second air clean unit 128 and reached a lower part of the carriers handling space 123. Furthermore, an air drawing duct 135 is provided in the carriers storage unit 49, and an exhaust duct 135 is provided in a lower part of a side wall of the wafers handling space 124.

Figure 14:
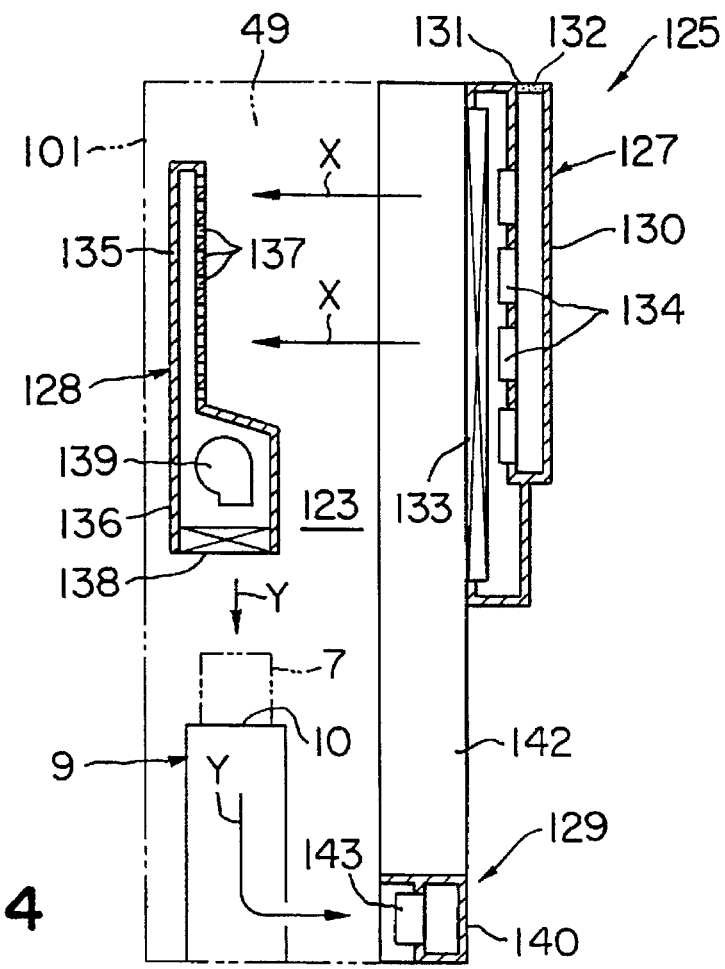
FIG. 14 is a vertical sectional view of the clean air circulation unit disposed in the carriers handling space of the treatment device.

The first clean air unit 127 has a box-shaped casing 130 disposed on the back of the rear carriers storage unit 49A. As shown in FIG. 14, the casing 130 has an air drawing port 131 in the upper end, which is opened in a clean room provided outside the handling chamber 1. A prefilter 132 of a highly air permeable sponge or mesh is provided in the air drawing port 131.

As shown in FIG. 14, the front of the casing 130 is opened and confronted to the carriers storage unit 49. In this opening there is provided a first dust removing filter 133 in the form of, e.g., an HEPA filter or others for removing dust contained in the clean air introduced into this opening from the clean room. A plurality of blowers 134 having good blow in the form of, e.g., sirocco fans are provided in the casing 130 for drawing clean air from the air drawing port 131 and horizontally blowing the clean air to the carriers storage unit 49 through the first dust removing filter 133. Thus the horizontal streams X of the clean air flowing from the rear carriers storage unit 49A to the front carriers storage unit 49B shown in FIG. 1 are formed, whereby the atmosphere between the semiconductor wafers W held horizontal in the carriers stored in the carriers storage unit 49 is maintained clean.

As shown in FIGS. 13 and 14, the second clean air unit 128 is provided below the front carrier storage unit 49B and above the carriers feed in/out opening 8. The second clean air unit 128 has a casing 136 with a flat air drawing duct 135 which extended upward along the back of the front carriers storage unit 49B. A number of punched air drawing holes 137 in the side of the air drawing duct opposed to the carriers storage unit 49. As shown in FIG. 14, a second dust removing filter 138 which is the same as the first dust removing filter 133 is provided in the bottom opening of the casing 136. In the casing 136 there is provided a blower 139 which blows the clean air drawn through the air drawing holes 137 downward through the second dust removing filter 138. Thus, as show in FIG. 12, the vertical streams Y of the clean air which flows from the front carriers storage unit 49B downward along the carriers feed in/out port 8 are formed, whereby the atmosphere between the semiconductor wafers W held vertical in the carriers placed on the mount 10 of the posture changing mechanism 9 is maintained clean.

As shown in FIG. 12, an exhaust duct 129 is disposed downstream of the vertical streams Y and below the transfer unit 50. This exhaust duct 129 mainly comprises a duct body 140 laid horizontal across the bottom of the handling chamber 1, and a vertical duct 142 communicated with a side of the duct body 142 and having the upper end opened in the top of the handling chamber 1 as an exhaust port 141 to the outside. In the front side of the duct body 140 there are provided a plurality of exhaust blowers 143.

Figure 15:
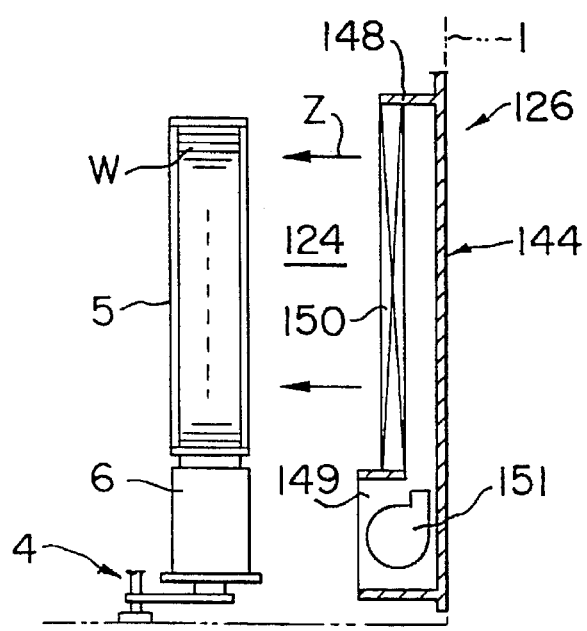
FIG. 15 is a vertical sectional view of the clean air circulation unit disposed in the wafers handling space of the treatment device according to the present invention.

As shown in FIGS. 13 and 15, the clean air circulation unit 126 of the wafer handling space 124 comprises a third clean air unit 144 which horizontally injects the clean air introduced from the outside at the rear of the handling chamber 1 from one side wall of the wafer handling space 124 to the other side wall, and an exhaust unit 145 which discharges outside at the rear of the handling chamber 1 the clean air which has been injected by the third clean air unit 144 and reached to the other side wall. Specifically as shown in FIG. 13, at the rear of the handling chamber 1 there are provided an opening for the maintenance and inspection and a door 146 which opens and closes the opening. An air drawing port 147 is formed below the door 146. The third clean air unit 144 draws clean air through the air drawing port 147 from the outside at the rear of the handling chamber 1. As shown in FIG. 15, the third clean air unit 144 has a flat casing 148 mounted on one side wall of the wafer handling space 124. An air drawing port 149 is formed in a lower part of the front of the casing 148. The part of the front of the casing 148 above the air drawing port 149 is opened, and in this opening there is provided a third dust removing filter 150 which is the same as the first dust removing filter 133.

In the air drawing port 149 there is also provided a blower 151 which draws the clean air introduced through the air drawing port 147 and injects the clean air horizontally into the wafers handling space 124 through the third dust removing filter 150. Thus the horizontal streams Z (see FIGS. 13 and 15) of the clean air flowing from one side of the wafers handling space 124 to the other side wall thereof are formed, whereby the atmosphere between the semiconductor wafers held horizontally on the wafer boat 5 can be maintained clean, and the wafer boat 5 unloaded out of the heat treatment furnace 2, and heat treated semiconductor wafers W can be cooled. An exhaust unit 145 in the form of, e.g., an exhaust fan is provided at a lower part of the rear wall of the handling chamber 1 which is near to the other side wall thereof, and the clean air arriving at the other side wall is exhausted to the outside at the rear of the handling chamber 1.

Next, the operation of the clean air circulation system of the first embodiment will be explained. As shown in FIG. 1, carriers 7 are placed onto the mount 10 of the posture changing mechanism 9 by, e.g., a conveyance robot or other means through the carriers feed in/out port 8. The mount 10 is swung down by 90 degrees to swing the carriers 7 by 90 degrees downward, whereby semiconductor wafers W have their posture changed from vertical to horizontal. The carriers 7 are conveyed to the carriers storage unit 49 by the conveying mechanism 51. This operation is repeated to store a required number of carriers 7 in the carriers storage unit 49.

Then, the carriers 7 temporarily stored in the carriers storage unit 49 are transferred one by one to the transfer unit 50 by the conveying mechanism 51, and the semiconductor wafers W held in the carriers 7 are transferred one by one or collectively by a plurality of sheets to the wafer boat 5 lowered in the wafer handling space 124. Emptied carriers 7 are sequentially returned to the carriers storage unit 49 by the conveying mechanism 51.

When a required number of semiconductor wafers W have been transferred, the wafer boat 5 and the heat insulating cylinder 6 are loaded into the heat treatment furnace 2 by the lift mechanism 4. Then the furnace entrance is closed by the cap 3, and a required heat treatment is conducted for a set period of time, at a set temperature and in a set atmosphere. When the heat treatment is over, the wafer boat 5 is unloaded out of the heat treatment furnace 2 into the wafers handling space. The treated semiconductor wafers W are cooled, and are transferred from the wafer boat 5 into the carriers 7 in the procedure opposite to the above. The carriers 7 are conveyed to the carriers storage unit 49 to be stored there, and then are conveyed outside the handling chamber 1 on the mount 10 of the posture changing mechanism 9 through the carriers feed in/out opening 8.

In the handling process of conveyance, transfer, etc. of the carriers 7 and semiconductor wafers W, as shown in FIG. 12, in the carriers handling space 123, first of all the first clean air unit 127 injects clean air introduced from the outside at the top of the handling chamber 1 through the prefilter 132 to the carriers storage unit 49 in the horizontal streams X through the first dust removing filter 133. Next, the second clean air unit 128 draws the horizontal streams X of the clean air through the air drawing holes 137 (FIG. 14) of the air drawing duct 135 to inject downward the clean air in the vertical streams Y through the second dust removing filter 138. Then, the exhaust duct unit 135 draws the vertical streams Y of the clean air into the duct body 140 and discharges the clean air outside through the vertical duct 142 at the top of the handling chamber 1. Thus the horizontal streams X of the clean air can maintain cleanness of the atmosphere between the semiconductor wafers W held horizontal in the carriers 7 stored in the front and the rear carriers storage units 49B, 49A. Furthermore, the vertical streams Y of the clean air can maintain the cleanness of the atmosphere between the semiconductor wafers W held parallelly vertical in the carriers placed on the mount 10, which is the posture changing mechanism 9.

As shown in FIGS. 13 and 15, in the wafer handling space 124, first of all the third clean air unit 144 injects the clean air introduced from the outside through the air drawing port 147 in the rear of the handling chamber 1 to the wafers handling space 124 in the horizontal streams Z through the third dust removing filter 150. Then, the exhaust unit 145 discharges the horizontal streams Z of the clean air to the outside at the rear of the handling chamber 1. Thus the horizontal streams Z of the clean air can maintain the cleanness of the atmosphere between the semiconductor wafers W held parallelly horizontal on the wafer boat 5, and can efficiently cools the wafer boat 5 unloaded out of the heat treatment furnace 2 to the wafers handling space 124 and the heat treated semiconductor wafers W.

Especially, the interior of the handling chamber 1 is divided in the carriers handling space 123 and the wafers handling space (loading area) 124, and the clean air circulation units 125, 126 which are independent from each other are provided respectively in the carrier handling space 123 and the wafer handling space 124. Accordingly in comparison with the conventional heat treatment device in which clean air is passed a plurality of times through the air cleaning units to continuously circulate the clean air through the entire interior of the handling chamber, in the first embodiment clean air may be passed through the clean air units less times, so that impurity gases generated from the dust removing filters of the clean air units can be sufficiently decreased by the simple arrangement without the necessity of special countermeasures. In addition, clean air is supplied to and circulated through the carriers handling space 123 and the wafers handling space 124 respectively by the clean air circulation units 125, 126 which are independent from each other, whereby the blow amounts of the clean air circulation systems 125, 126 can be small, and the blowers 134, 139, 143, 151 may be small-sized. The heat treatment device can be accordingly smaller-sized.

Furthermore, because the clean air circulation systems 125, 126 are provided independently from each other in the carrier handling space 123 and the wafer handling space 124, it is easy that the carrier handling space 123 and the wafers handling space 124, for example, are divided by a shutter being capable of being opened and closed, or the like, whereby the atmosphere in the handling chamber 1 is separated for the carriers handling space 123 and the wafers handling space 124. Accordingly this arrangement is readily applicable to a required treatment method using, for example, only the interior of the wafers handling space 124 in an atmosphere of an inert gas, e.g., nitrogen (2) gas. In this case, the air drawing port 147 and t exhaust unit 145 are closed, and the wafers handling space 124 is supplied with an inert gas by supply and exhaust means exclusively used for the inert gas. In the heat treatment device according to the first embodiment, the air drawing port 131 and the exhaust port 141 of the clean air circulation unit 125 of the carriers handling space 123 are provided in to top of the handling chamber 1, and the air drawing port 147 of the clean air circulation unit 126 of the wafers handling space 124, and the exhaust unit 145 are disposed on the rear of the handling chamber 1. Accordingly even in a case that a plurality of the heat treatment devices are juxtaposed with each other, drawing and exhaust of clean air into/from the handling chamber 1 can be conducted without troubles.

The present invention is not limited to the clean air circulation unit of the first embodiment and covers other variations and modifications in the scope of the present invention. For example, in the first to the third clean air units 127, 128, 144 of the first embodiment, active carbon filters, for example, which adsorb to remove impurity gases may be provided in addition to the first to the third dust removing filters 133, 138, 150, so that contamination of the semiconductor wafers W by impurity gases can be prevented. n the first embodiment, the clean air circulation unit 126 of the wafers handling space 124 introduces clean air through the air drawing port 147 provided in the door 146. In place of the air drawing port 147, an air drawing port which directly introduces clean air from the outside at the rear of the handling chamber 1 may be provided in the third clean air unit 144 in addition to the air drawing port 149.

[Second Embodiment]

Figure 16:
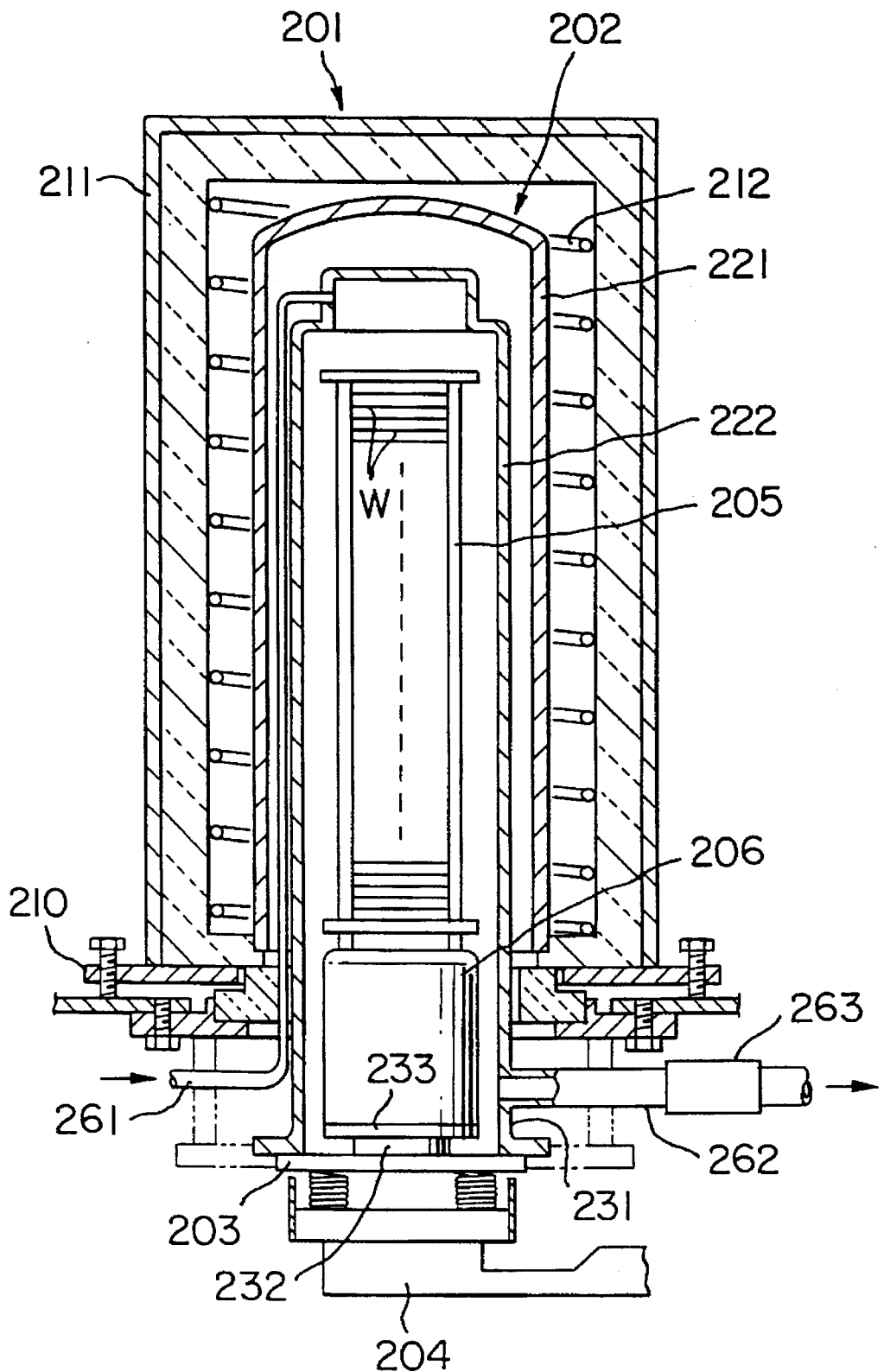
FIG. 16 is a vertical sectional view of the vertical heat treatment device according to a second embodiment of the treatment device of the present invention.

FIG. 16 is a vertical side view of one example of the vertical heat treatment device according to a second embodiment of the present invention. A heating furnace 201 is mounted on a base plate 210. The heating furnace 201 includes a heater 212 disposed on the inside circumferential surface of a heat insulating layer 211 in such a manner as to surround a reaction tube 202 which will be explained later. A double structure reaction tube 202 is provided in the heating furnace 201. The double structure reaction tube 202 comprises an outer tube 221 of, e.g., quart having the upper end closed, and an inner tube 222 of, e.g., quartz disposed conically with the outer reaction tube 221, and is for forming an atmosphere to be treated.

The outer tube 221 and the inner tube 222 are supported at the respective lower ends by a tubular manifold 231 of stainless steel or others. A cap 203 is provided in the open lower end of the manifold 231 for openably sealing the open end air-tightly. A rotary shaft 232 which can rotate in an air-tight state by, e.g., a magnetic seal is passed through the central part of the cap 203. The rotary shaft 232 has the lower end connected to a rotary lift mechanism (not shown) of a boat elevator 203 and has the upper end fixed to a turntable 233.

A wafer boat 205 which is a holder for objects to be treated is mounted on the turntable through a heat insulating cylinder 206 which is an intermediate member. The wafer boat 205 can accommodate, e.g., 100 sheets of semiconductor wafers W laid one on another at a certain interval. The heat insulating cylinder 206 is for thermally sealing a heat treatment region in the reaction tube 202 from the outside to keep the heat treatment region heated and for protecting a lower part of the reaction tube 2 from heat of the heat treatment region.

A processing gas feed pipe for introducing a processing gas, e.g., monosilane gas into the reaction tube 202 is inserted horizontal in the reaction tube at a lower side of the manifold 231. The processing gas feed pipe 261 is connected to a gas supply source. An exhaust pipe 262 connected to a vacuum pump 273 is connected to an upper side of the manifold 231 for discharging a processing gas from a gap between the outer tube 221 and the inner tube 222 to establish a required lower pressure atmosphere in the reaction tube 202.

Figure 17:
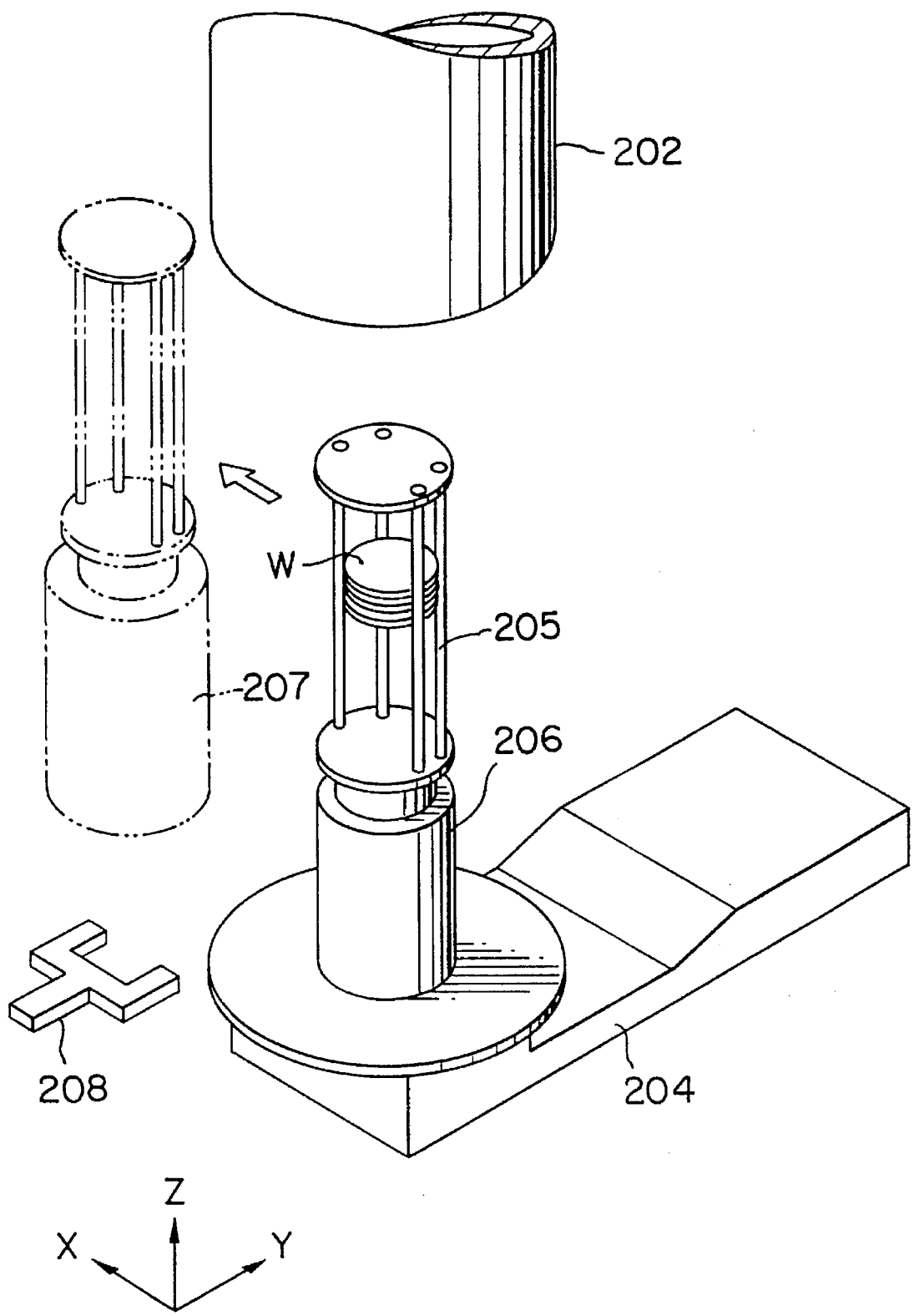
FIG. 17 is a perspective view of the objects-to-be-treated holder (wafer boat) and the heat insulating cylinder of the vertical heat treatment device of FIG. 16.

As shown in FIG. 17, beside a lower outer side of the reaction tube 202 there are provided a mount for the wafer boat which has been unloaded out of the reaction tube to be placed on, e.g., a wafer boat mount 207, and transfer means 208 which is movable in X, Y and Z directions for transferring the wafer boat 205 between the heat insulating cylinder 206 and the mount 207.

Then a process of the treatment method according to the second embodiment using the above-described heat treatment device will be explained. The wafer boat 205 holding, e.g., totally 100 sheets of wafers W to be treated including dummy wafers is lifted by the boat elevator 204 to load the wafers W into the reaction tube 201 as shown in FIG. 16. At this time, a temperate of the interior of the reaction tube 201 is set, e.g., about 400° C. Then the interior of the reaction tube 201 is heated up to a required temperature, e.g., 650° C., and a processing gas, e.g., monosilane gas is introduced into the reaction tube 201 through the processing gas feed pipe 261. At the same time, the interior of the reaction tube 201 is evacuated by the vacuum pump 263 through an exhaust pipe 262 to maintain the interior of the reaction tube 201 at a required pressure. And CVD processing is conducted on the wafers W.

Figure 18:
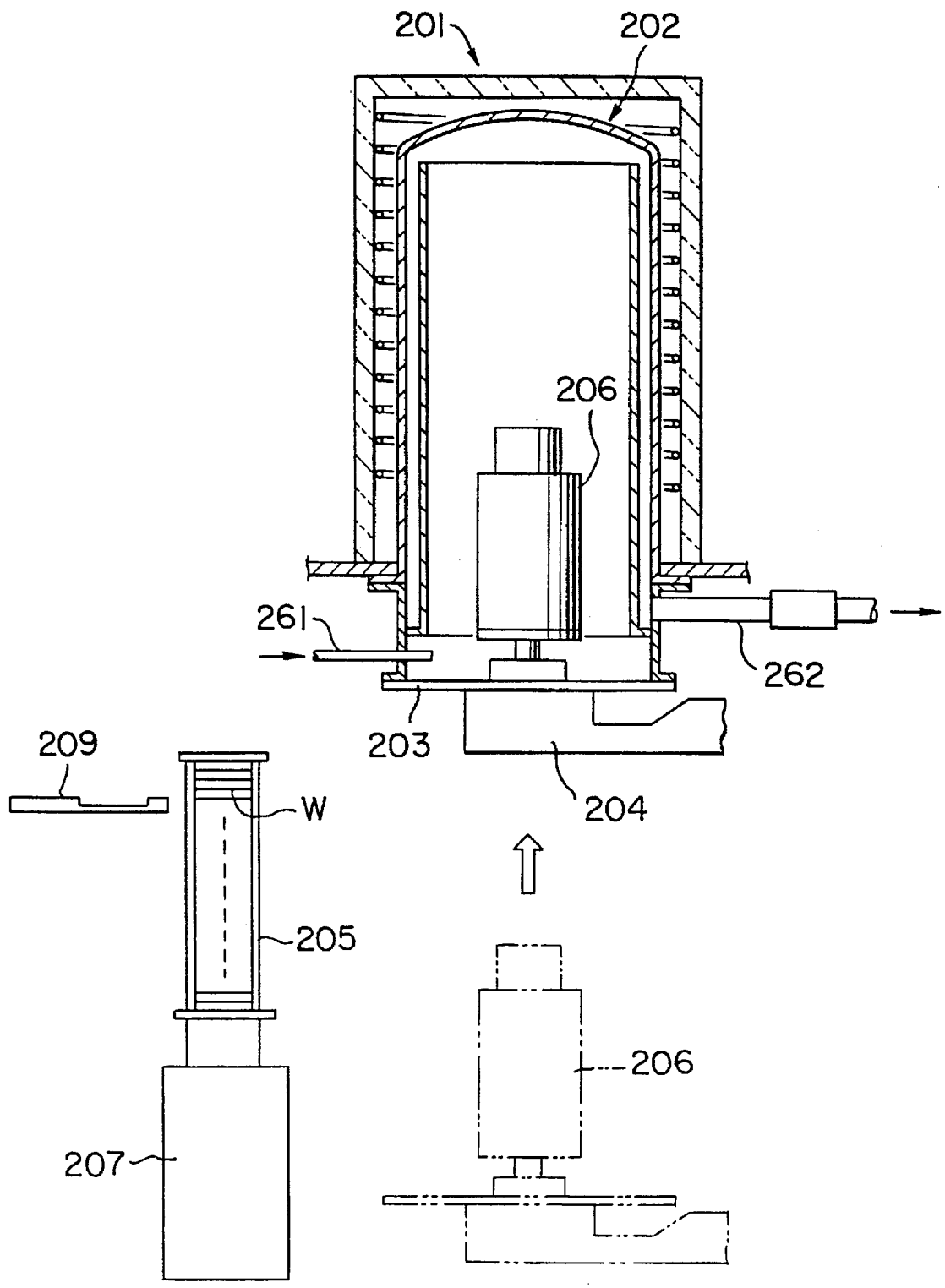
FIG. 18 is a diagrammatic structural view for explaining a process conducted by the vertical heat treatment device of FIG. 16.

Then, the boat elevator 204 is lowered to lower the wafer boat 205 so as to unload the treated wafers W out of the reaction tube 201, and the wafer boat 205 on the boat elevator 204 is transferred from the heat insulating cylinder 206 to the mount 207 by the transfer means 208. As shown in FIG. 18, the heat insulating cylinder with the wafer boat 205 dismounted is loaded into the reaction tube 201 by lifting the boat elevator 204. In the wafer boat 205 placed on the mount 207, the treated wafers W are cooled down to, e.g., about 100° C. and then take off the wafer boat 205 by wafer transfer means 209. Then wafers W to be treated are transferred to the wafer boat 205.

On the other hand, in the reaction tube 202, the interior of the reaction tube 201 is heated by the heater 202 up to a temperature, e.g., 800° C. higher than a processing temperature, so that adsorbed water, etc. are eliminated from the heat insulating cylinder 206 with the wafer boat 205 dismounted, and the inside wall of the reaction tube 201. Then the heat insulating cylinder 206 is lowered by the boat elevator 204 to be unloaded out of the reaction tube 201, and the wafer boat 204 is transferred onto the heat insulating cylinder 206 from the mount 207 by the transfer means 208. Then the wafer boat 205 is lifted by the boat elevator 204 to load the wafers W into the reaction tube 201.

Figure 19:
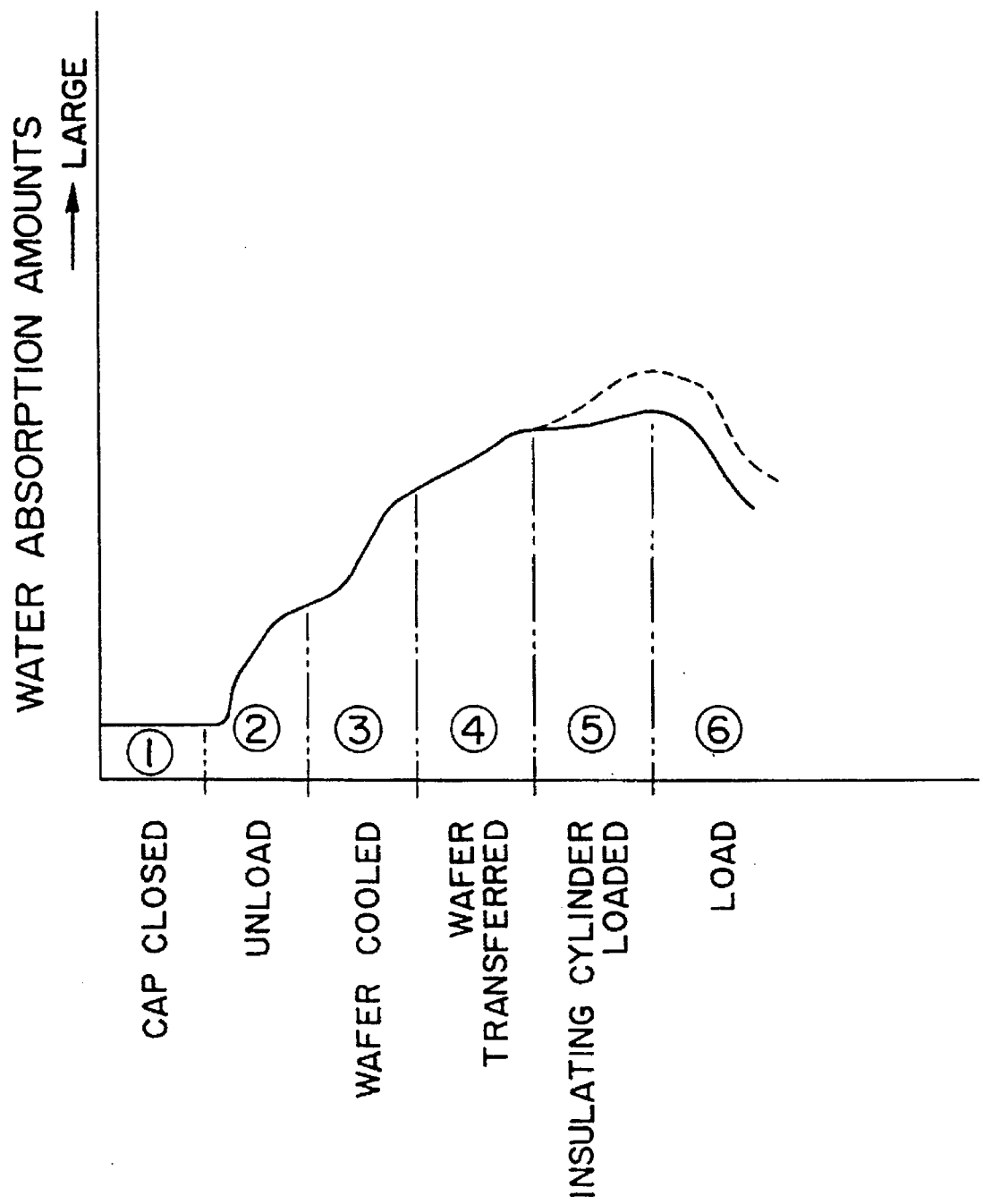
FIG. 19 is a characteristic curve showing water adsorbing mechanism of the objects-to-be-treated holder, the heat insulating cylinder and objects-to-be-treated of the second embodiment of the present invention.
Figure 20:
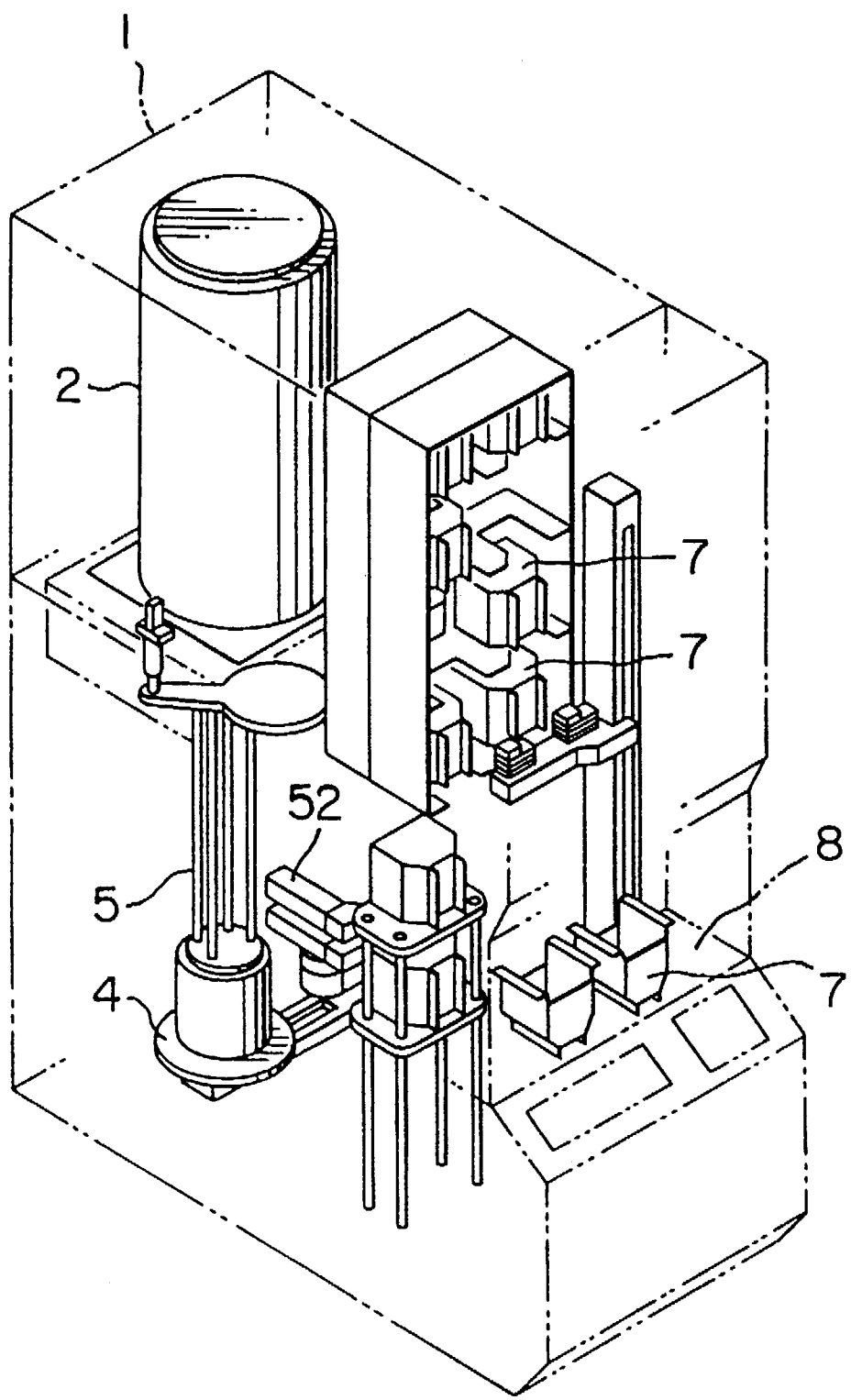
FIG. 20 is a diagrammatic perspective view of a conventional heat treatment device.
Figure 21:
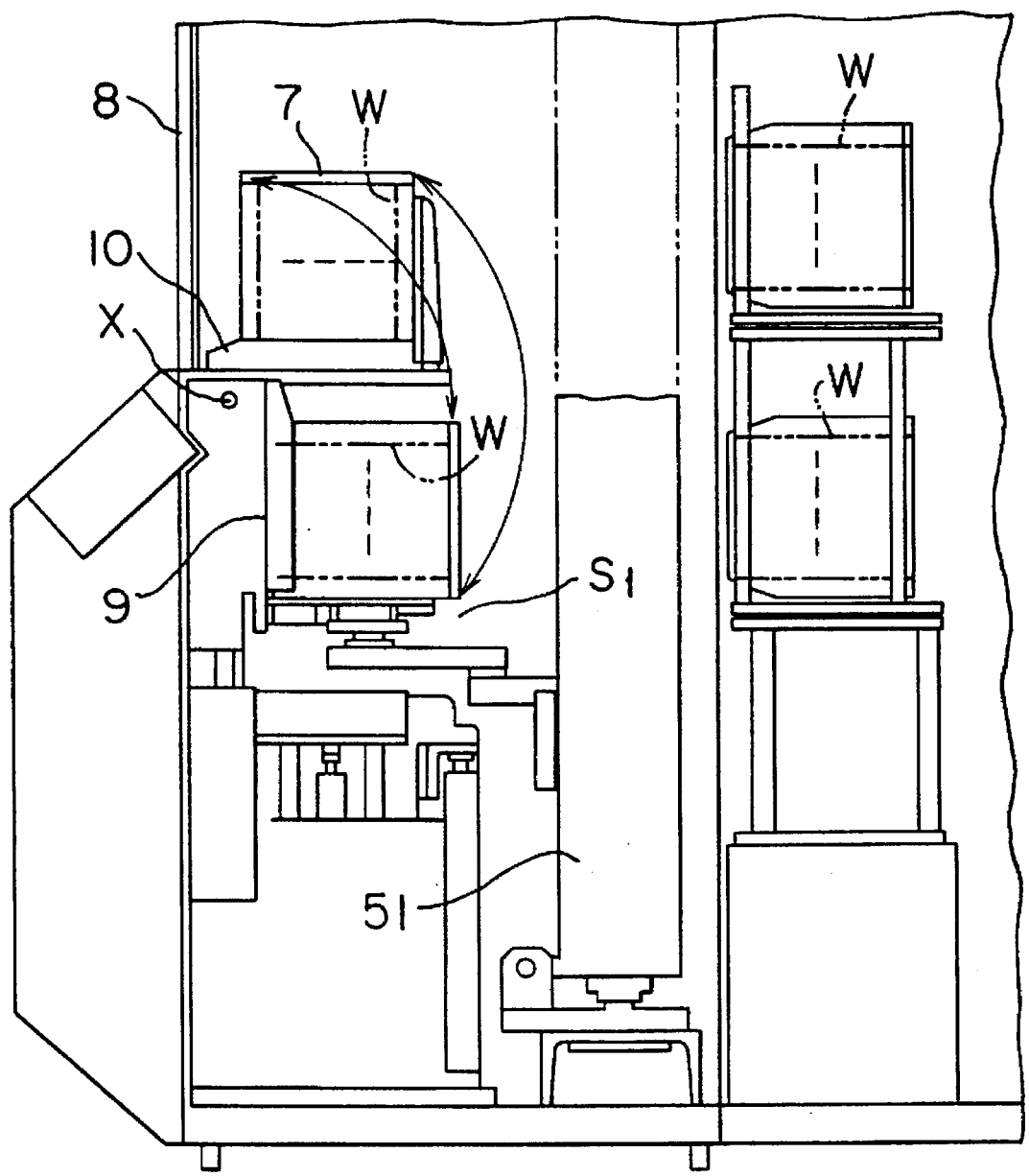
FIG. 21 is a partially enlarged view of a carrier posture changing mechanism of the vertical heat treatment device of FIG. 20.

Here relationships between this process, and water adsorption amounts of the wafer boat, of the heat insulating cylinder and of the wafers W held on the wafer boat will be explained with reference to FIG. 19. Water adsorption amounts of the wafer boat, etc. after CVD is conducted on the wafers W in the reaction tube are small (Step 1), but when the wafers W are unloaded out of the reaction tube, the wafer boat, the heat insulating cylinder and the wafers W contact with air and adsorb water in the air. Their water adsorption amounts increase (Step 2).

Then, the wafer boat is transferred from the heat insulating cylinder to the mount. The wafers W are cooled there on the mount and transferred, and the heat insulating cylinder is loaded into the reaction tube. While the wafers W are being cooled and transferred, the wafer boat and wafers are placed in air, and absorb water in the air (Steps 3 and 4). But the heat insulating cylinder is returned into the reaction tube and does not contact with air. Increase of an amount of water adsorbed on the heat insulating cylinder is suppressed. Since the interior of the reaction tube is heated, water brought into the reaction tube, adsorbed on the heat insulating cylinder when the heat insulator cylinder is loaded and unloaded is decomposed by this heat into hydrogen gas and oxygen gas, and eliminated and removed, while components, such as carbon, sulfur, etc. adsorbed together with the water on the heat insulating cylinder are also eliminated. In FIG. 19, the broken line indicates a total water adsorption amount by a conventional method. In comparison with the conventional heat treatment method, in which wafers re cooled and transferred on the heat insulating cylinder, a total water adsorption amount of the wafer boat, dummy wafers and heat insulating cylinder is decreased by a decrease amount of a water adsorption amount of the heat insulating cylinder (Step 5). Then, when the heat insulating cylinder is unloaded to transfer the wafer boat onto the heat insulating cylinder, and wafers W are loaded into the reaction tube, water adsorbed on the wafer boat and the wafers is eliminated by raising a temperature of the interior of the reaction tube, and water adsorption amounts are decreased (Step 6).

In the second embodiment of the present invention, while treated wafers are unloaded out of the reaction tube, and wafers to be treated are loaded into the reaction tube, the heat insulating cylinder with the wafer boat dismounted is loaded in the reaction tube for baking, whereby the heat insulating cylinder contacts with air for a shorter time, and mounts of water and other impurities to be adsorbed on the heat insulating cylinder by contact with air can be decreased. With a result water amounts to be brought into the reaction tube when a heat treatment is conducted can be reduced. Here, the heat insulating cylinder has a 300 mm-height and an accordingly large surface area. Because of this large surface area, larger water amounts are adsorbed to the heat insulating cylinder by contact with air. It takes some time to cool the wafers and transfer them, and while the heat insulating cylinder is left in air during the cooling and the transfer, the heat insulating cylinder adversely adsorbs some water. Amounts of water to be adsorbed on the heat insulating cylinder can be drastically decreased by lading the heat insulating cylinder with the wafer boat dismounted.

Furthermore, water adsorbed on the heat insulating cylinder by its contact with air when the wafers are unloaded is decomposed into $H_2$ gas and $O_2$ gas and eliminated by heat given when, during transfer of the wafers, the heat insulating cylinder alone is loaded into the reaction tube, and the interior of the reaction tube is heated. Impurities, such as C, S, etc. can be similarly eliminated, with a result that amounts of impurities can be reduced. Because this elimination of the water, etc. is conducted at high temperatures than heat treatments of the wafers, when water to be decomposed when a next heat treatment is conducted in the reaction tube can be eliminated and removed in advance. As a result, amounts of impurities in the reaction tube at the time of a heat treatment on the wafers can be reduced, and formation of natural oxide films can be accordingly suppressed.

In the heat treatment method according to the present embodiment, when water adsorbed on the heat insulating cylinder is eliminated, the heat insulating cylinder is heated, so that an advantage that a time for stabilizing the reaction tube taken when a next heat treatment is conducted on wafers in the reaction tube can be shortened can be obtained.

To confirm the above-described effects of the heat treatment method according to the present invention, film deposition was conducted by the method according to the present invention using monocrystal silicon and monosilane gas, and epitaxial films were obtained. As the processing conditions, a flow rate of monosilane gas was 1–10 SCCM, a pressure was 0.01 - Torr, and a heat treatment temperature was 650° C. The same film deposition was conducted by the conventional method, and polysilicon films were obtained. Here, an epitaxial film grows based on the crystal information of monocrystal silicon, and when a natural oxide film is formed on the monocrystal silicon, epitaxial growth cannot be made. Accordingly, based on the above-described results, it was confirmed that the method according to the present invention can reduce impurities, such as water, in the reaction tube, and formation of natural oxide films can be suppressed.

By thus suppressing formation of natural oxide films, low contact resistance can be obtained. In addition, capacitance insulating films of $Si_3N_4$-$SiO_2$ films (the so-called N-O films) can be realized, and epitaxial growth in batch furnaces can be realized. Thus the method according to the second embodiment is very effective in fabricating devices of high integration and micronized patterns by batch heat treatment furnaces. But the present invention is not limited to CVD and may be applied to oxidation and diffusion. The present invention is also applicable to a device whose wafer transfer region below the reaction tube is purged with an inert gas, e.g., $N_2$ gas. In this case, amounts of water to be brought in by the inert gas in heat treatments can be reduced.

What is claimed is:

1. A treatment method for conveying carriers holding plural sheets of objects to be treated parallelly vertical into a vertical heat treatment furnace through a carriers feed in/out opening of a handling chamber accommodating the vertical heat treatment furnace, the method comprising the steps of;

swinging the carriers near the carriers feed in/out opening of the handling chamber on a rotational center into a territory of lower sides of the carriers to change the posture of the objects to be treated from the vertical position to the horizontal position;

conveying the carriers whose posture has been changed to a carriers storage unit provided in an area above the carriers feed in/out opening, and wherein orientation flat alignment of the objects to be treated is conducted by independent orientation flat arranging means prior to the posture changing step.

2. A heat treatment device comprising:

a handling chamber including a carriers feed in/out opening for carriers holding plural sheets of objects to be treated parallelly vertical, and housing a vertical heat treatment furnace for heat treating the objects to be treated;

posture changing means disposed in the handling chamber and near the carriers feed in/out opening for swinging the carriers near the carriers feed in/out opening of the handling chamber on a rotational center into a territory of lower sides of the carriers to change the posture of the objects to be treated from the vertical position to the horizontal position;

a carriers storage unit disposed above the posture changing means and being capable of storing a plural number of the carriers whose posture has been changed;

conveying means for conveying the carriers between the carriers storage unit and the posture changing means, and the side of the heat treatment furnace;

transfer means for transferring the objects-to-be-treated to/from an objects-to-be-treated holder for loading and unloading into/out of the heat treatment furnace the carriers conveyed to the side of the heat treatment furnace, and the posture changing means comprises:
  a mount for the carriers to be placed on;
  support means for supporting the mount so that the mount is swung on a rotational center set in a territory of sides of the carriers placed on the mount;
  drive means for swinging the mount on the rotational center so that the mount rises vertical along the inside of the carriers feed in/out opening; and
  a receiver disposed on the mount for supporting lower parts of the carriers whose posture has been changed.

3. The heat treatment device according to claim 2, wherein
  the mount includes aligning means for aligning the objects-to-be-treated held in the carriers in a set direction in register with orientation flat portions thereof.

4. The heat treatment device according to claim 3, wherein
  the aligning means comprises a pair of left and right rotation rollers on a support frame, which are rotatably spaced from each other by a width of the orientation flat portions and have a plurality of annular grooves for supporting the objects to be treated; a motor for rotating the rotation rollers in one direction by a belt, and a pair of wafer guides disposed on both sides of the roller.

5. The heat treatment device according to claim 2, wherein
  the mount includes detecting means for detecting directions of the orientation flat portions of the objects to be treated held in the carriers.

6. The heat treatment device according to claim 5, wherein
  the detecting means are disposed between the rollers of the pair on which the objects to be treated are aligned with the orientation flat portions supported, and the detecting means have an end opposed to the orientation flat portions formed in a digital shape, light irradiating devices and light detecting devices being provided respectively on opposed walls of the digits.

7. A heat treatment device comprising:
a handling chamber;
a carriers handling space which is defined in the handling chamber and in which carriers each holding plural sheets of objects to be treated are fed in/out, stored, and conveyed;
an objects-to-be-treated handling space which is defined in the handling chamber, divides the carriers handling space from the handling chamber, houses a heat treatment furnace, includes an objects-to-be-treated holder for loading and unloading the objects to be treated into/out of the heat treatment furnace, and transfers the objects to be treated between the objects-to-be-treated holder and the carriers;

clean air circulation units which are independent from one another and which introduce to circulate clean air in the carriers handling space and the objects-to-be-treated handling space and discharges the clean air, and wherein the clean air circulation unit disposed in the carriers handling space includes;

a first clean air unit for injecting clean air introduced from the outside at the top of the handling chamber horizontally to a carriers storage unit provided in an upper part of the interior of the carriers handling space;

a second clean air unit for drawing clean air injected from the first clean air unit and injecting the clean air downward along a carriers feed in/out opening disposed in the front of the handling chamber; and an exhaust duct for discharging to the outside at the top of the handling chamber clean air injected by the second clean air unit and reaching a lower part of the handling chamber.

8. The heat treatment device according to claim 7, wherein
  the clean air circulation unit disposed in the objects-to-be-treated handling space includes a third clean air unit for injecting clean air introduced from the outside at the rear of the handling chamber horizontally from one side wall of the objects-to-be-treated handling space and the other side wall thereof; and an exhaust unit for discharging clean air injected by the third clean air unit and reaching the other side wall to the outside at the rear of the handling chamber.

9. A heat treatment device comprising:
a handling chamber including a carriers feed in/out opening for carriers holding plural sheets of objects to be treated parallelly vertical, and housing a vertical heat treatment furnace for heat treating the objects to be treated;

posture changing means disposed in the handling chamber and near the carriers feed in/out opening for swinging the carriers near the carriers feed in/out opening of the handling chamber on a rotational center into a territory of lower sides of the carriers to change the posture of the objects to be treated from the vertical position to the horizontal position;

a carriers storage unit disposed above the posture changing means and being capable of storing a plural number of the carriers whose posture has been changed;

conveying means for conveying the carriers between the carriers storage unit and the posture changing means, and the side of the heat treatment furnace; and transfer means for transferring the objects-to-be-treated to/from an objects-to-be-treated holder for loading and unloading into/out of the heat treatment furnace the carriers conveyed to the side of the heat treatment furnace, and wherein the posture changing means includes a mount with detecting means for detecting directions of the orientation flat portions of the objects to be treated held in the carriers.

10. A heat treatment device comprising:

a handling chamber including a carriers feed in/out opening for carriers holding plural sheets of objects to be treated parallelly vertical, and housing a vertical heat treatment furnace for heat treating the objects to be treated;

posture changing means disposed in the handling chamber and near the carriers feed in/out opening for swinging the carriers near the carriers feed in/out opening of the handling chamber on a rotational center into a territory of lower sides of the carriers to change the posture of the objects to be treated from the vertical position to the horizontal position;

a carriers storage unit disposed above the posture changing means and being capable of storing a plural number of the carriers whose posture has been changed;

conveying means for conveying the carriers between the carriers storage unit and the posture changing means, and the side of the heat treatment furnace; and transfer means for transferring the objects-to-be-treated to/from an objects-to-be-treated holder for loading and unloading into/out of the heat treatment furnace the carriers conveyed to the side of the heat treatment furnace, and wherein the posture changing means includes a mount having aligning means for aligning the objects-to-be-treated held in the carriers in a set direction in register with orientation flat portions thereof.

* * * * *